United States Patent
Yamazaki et al.

(10) Patent No.: US 11,356,089 B2
(45) Date of Patent: Jun. 7, 2022

(54) SEMICONDUCTOR DEVICE

(71) Applicant: Semiconductor Energy Laboratory Co., Ltd., Atsugi (JP)

(72) Inventors: Shunpei Yamazaki, Setagaya (JP); Seiichi Yoneda, Isehara (JP); Atsushi Miyaguchi, Hadano (JP); Tatsunori Inoue, Yamato (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/275,213

(22) PCT Filed: Sep. 17, 2019

(86) PCT No.: PCT/IB2019/057788
§ 371 (c)(1),
(2) Date: Mar. 11, 2021

(87) PCT Pub. No.: WO2020/065440
PCT Pub. Date: Apr. 2, 2020

(65) Prior Publication Data
US 2021/0399726 A1   Dec. 23, 2021

(30) Foreign Application Priority Data
Sep. 28, 2018   (JP) .............................. JP2018-184775

(51) Int. Cl.
*G11C 27/02*   (2006.01)
*H03K 5/00*   (2006.01)
(Continued)

(52) U.S. Cl.
CPC .............. *H03K 17/56* (2013.01); *H02J 50/20* (2016.02)

(58) Field of Classification Search
CPC ........... H03M 1/00; H03M 2201/4135; H03M 2201/4262; H03M 2201/4233;
(Continued)

(56) References Cited

U.S. PATENT DOCUMENTS 6,099,479 A   8/2000   Christopherson et al.
7,626,524 B2   12/2009   Horie
(Continued)

FOREIGN PATENT DOCUMENTS

DE   69712369   11/2002
DE   102007049545   4/2008
(Continued)

OTHER PUBLICATIONS

International Search Report (Application No. PCT/IB2019/057788) dated Dec. 10, 2019.
(Continued)

*Primary Examiner* — Quan Tra
(74) *Attorney, Agent, or Firm* — Robinson Intellectual Property Law Office; Eric J. Robinson

(57) ABSTRACT

Provided is a semiconductor device with a novel structure in which the power consumption can be reduced. The semiconductor device includes a sensor, a sample-and-hold circuit to which a sensor signal of the sensor is input, an analog-digital converter circuit to which an output signal of the sample-and-hold circuit is input, a control circuit, a battery, and an antenna. The sample-and-hold circuit includes a first selection circuit, a plurality of signal retention circuits, and a second selection circuit, and the control circuit performs a control so that a potential corresponding to the sensor signal is retained in the plurality of signal retention circuits successively by the first selection circuit in a first period during which power is supplied from the battery, and performs a control so that the output signal
(Continued)

based on the potential retained in the plurality of signal retention circuits is output by the second selection circuit in a second period during which power is supplied from outside through the antenna.

14 Claims, 24 Drawing Sheets

(51) Int. Cl.
*H03K 17/00* (2006.01)
*H03K 17/56* (2006.01)
*H02J 50/20* (2016.01)

(58) Field of Classification Search
CPC ............. H03M 2201/02; G11C 27/026; G11C 27/024; G11C 27/02; G01R 13/342; H03K 17/063
USPC ...................................................... 327/91–98
See application file for complete search history.

(56) References Cited

U.S. PATENT DOCUMENTS

| | | | |
|---|---|---|---|
| 7,932,846 B2 | 4/2011 | Imai | |
| 9,859,905 B2 | 1/2018 | Shionoiri et al. | |
| 10,091,563 B2 | 10/2018 | Koyama | |
| 10,193,563 B2 | 1/2019 | Shionoiri et al. | |
| 2007/0282383 A1 | 12/2007 | Koyama | |
| 2008/0094272 A1 | 4/2008 | Horie | |
| 2010/0103009 A1 | 4/2010 | Imai | |
| 2011/0121887 A1 | 5/2011 | Kato et al. | |
| 2012/0119808 A1* | 5/2012 | Motozawa | H04B 1/40 327/270 |
| 2016/0094236 A1 | 3/2016 | Shionoiri et al. | |
| 2016/0117584 A1* | 4/2016 | Yoneda | G06K 19/07707 235/492 |
| 2018/0084314 A1 | 3/2018 | Koyama | |
| 2018/0129831 A1* | 5/2018 | Yokoi | H01L 29/78696 |
| 2019/0149895 A1 | 5/2019 | Koyama | |

FOREIGN PATENT DOCUMENTS

| | | |
|---|---|---|
| JP | 2003-190303 A | 7/2003 |
| JP | 2008-125046 A | 5/2008 |
| JP | 2010-109602 A | 5/2010 |
| JP | 2015-092662 A | 5/2015 |
| JP | 2016-111677 A | 6/2016 |
| KR | 2016-0037085 A | 4/2016 |
| WO | WO-1997/049452 | 12/1997 |
| WO | WO-2016/139559 | 9/2016 |

OTHER PUBLICATIONS

Written Opinion (Application No. PCT/IB2019/057788) dated Dec. 10, 2019.

* cited by examiner

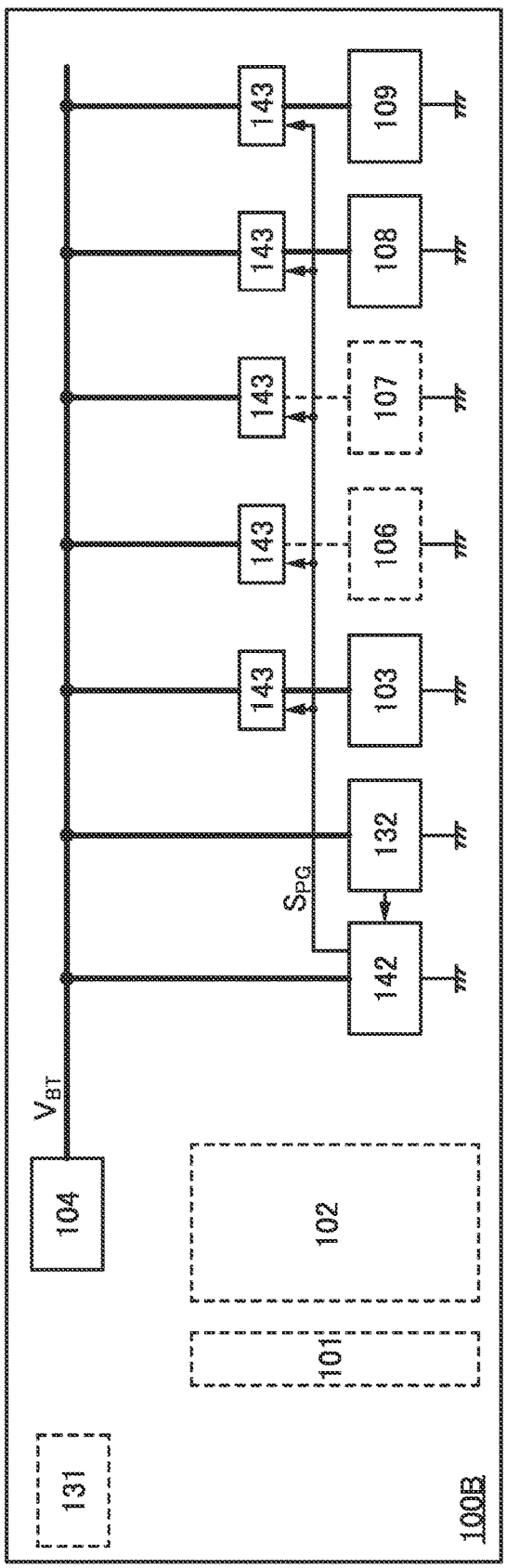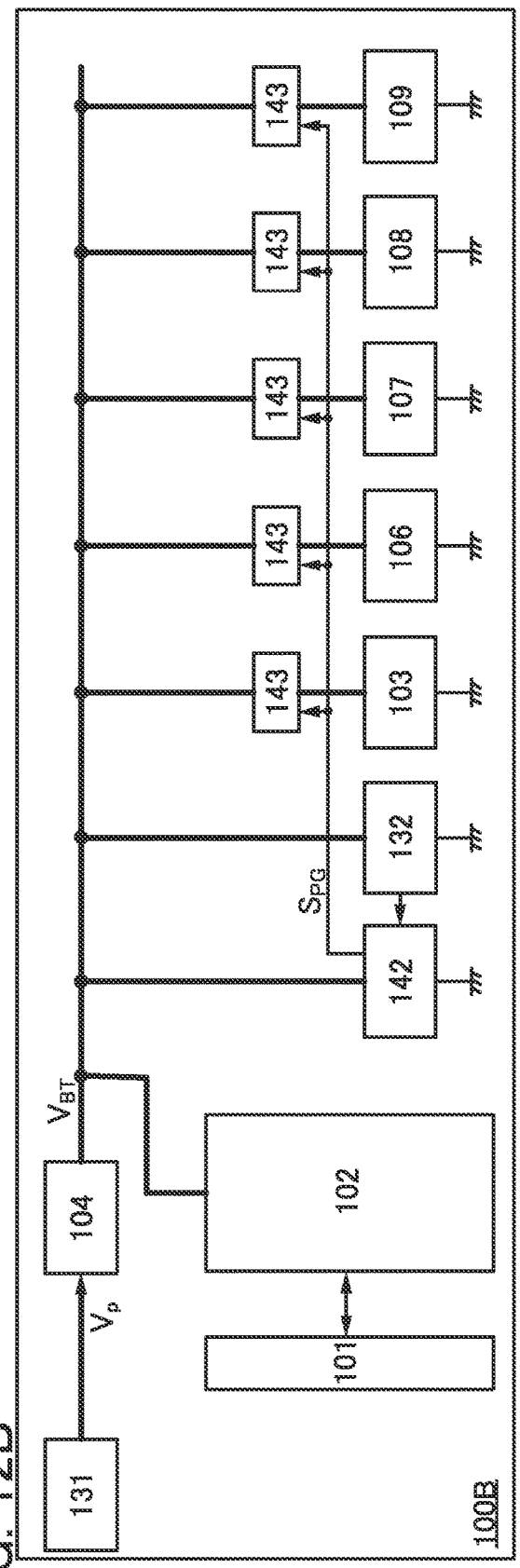

SEMICONDUCTOR DEVICE

TECHNICAL FIELD

One embodiment of the present invention relates to a semiconductor device.

In this specification and the like, a semiconductor device generally means a device that can function by utilizing semiconductor characteristics. It can be sometimes said that a display device (e.g., a liquid crystal display device and alight-emitting display device), a projection device, a lighting device, an electro-optical device, a power storage device, a memory device, a semiconductor circuit, an imaging device, a signal processing device, a transmitting/receiving device, a sensor device, and the like include a semiconductor device.

BACKGROUND ART

Research and development of human body implantable devices such as cardiac pacemakers have progressed. Replacing a battery in a human body implantable device causes significant decrease in convenience. Therefore, a structure in which a built-in battery is charged by a wireless signal such as an electromagnetic wave has been proposed (e.g., see Patent Document 1).

Meanwhile, research and development for reducing the power consumption of a semiconductor device have been progressed. For example, a semiconductor device that functions as a sensor-equipped signal processing device which includes an antenna, a sample-and-hold circuit, a sensor, and an analog-digital converter circuit (Analog to digital: hereinafter an A/D converter circuit) including a comparator and the like, has been proposed in Patent Document 2.

Patent Document 2 discloses a semiconductor device with a structure in which a momentary increase in the power consumption is inhibited in such a manner that operation of the sample-and-hold circuit and operation of the comparator are performed in different periods in a period during which power is supplied by a wireless signal.

REFERENCE

Patent Document

[Patent Document 1] United States Patent Application Publication No. 2007/0282383
[Patent Document 2] United States Patent Application Publication No. 2016/0094236

SUMMARY OF THE INVENTION

Problems to be Solved by the Invention

In the case where an analog voltage is retained in a period during which power is not supplied, the semiconductor device is driven with the power of the battery. When the charging frequency of the battery is reduced, the driving of the semiconductor device may be stopped. Furthermore, the characteristics of transistors included in a circuit that retains the analog voltage may be varied due to a change in the environmental temperature. Therefore, the accuracy of a digital signal obtained in the A/D converter circuit may decrease in a period in which power is supplied.

An object of one embodiment of the present invention is to provide a semiconductor device with a novel structure that is a semiconductor device functioning as a sensor-equipped signal processing device provided with a battery, in which long time driving can be achieved even under an environment with a low charging frequency of the battery. Another object of one embodiment of the present invention is to provide a semiconductor device with a novel structure, which can retain a signal of the sensor as an analog voltage even under an environment with a large variation of the outside temperature. Another object of one embodiment of the present invention is to provide a novel semiconductor device and the like.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention is a semiconductor device including a sensor, a sample-and-hold circuit to which a sensor signal of the sensor is input, an analog-digital converter circuit to which an output signal of the sample-and-hold circuit is input, a control circuit, a battery, and an antenna, in which the sample-and-hold circuit includes a first selection circuit, a plurality of signal retention circuits, and a second selection circuit; and the control circuit performs a control so that a potential corresponding to the sensor signal is retained in the plurality of signal retention circuits successively by the first selection circuit in a first period during which power is supplied from the battery, and performs a control so that the output signal based on the potential retained in the plurality of signal retention circuits is output by the second selection circuit in a second period during which power is supplied from outside through the antenna.

In one embodiment of the present invention, it is preferable that the sample-and-hold circuit include first to fourth transistors, and the first to fourth transistors each include a semiconductor layer including an oxide semiconductor in a channel formation region.

In one embodiment of the present invention, it is preferable that the first transistor function as a selection switch in the first selection circuit in the semiconductor device.

In one embodiment of the present invention, it is preferable that the signal retention circuit include the first and second transistors, a gate of the second transistor be electrically connected to one of a source and a drain of the first transistor, and the semiconductor device have a function of retaining a potential corresponding to the sensor signal when the first transistor is turned off In one embodiment of the present invention, it is preferable that the second and third transistors function as a source follower circuit in the semiconductor device.

In one embodiment of the present invention, it is preferable that the fourth transistor function as a selection switch in the second selection circuit in the semiconductor device.

In one embodiment of the present invention, it is preferable that a timer circuit and a power supply control circuit be included, and the power supply control circuit perform a control so that the sensor and the first selection circuit are operated intermittently, in accordance with an output signal of the timer circuit in the semiconductor device.

One embodiment of the present invention is a semiconductor device including a sensor, a sample-and-hold circuit to which a sensor signal of the sensor is input, an analog-digital converter circuit to which an output signal of the sample-and-hold circuit is input, a control circuit, a battery, and a photoelectric conversion device, in which the sample-and-hold circuit includes a first selection circuit, a plurality of signal retention circuits, and a second selection circuit, and the control circuit performs a control so that a potential corresponding to the sensor signal is retained in the plurality of signal retention circuits successively by the first selection circuit in a first period during which power is supplied from the battery, and performs a control so that the output signal based on the potential retained in the plurality of signal retention circuits is output by the second selection circuit in a second period during which power is supplied from the photoelectric conversion device.

In one embodiment of the present invention, it is preferable that the sample-and-hold circuit include first to fourth transistors, and the first to fourth transistors each include a semiconductor layer including an oxide semiconductor in a channel formation region in the semiconductor device.

In one embodiment of the present invention, it is preferable that the first transistor function as a selection switch in the first selection circuit in the semiconductor device.

In one embodiment of the present invention, it is preferable that the signal retention circuit include the first and second transistors, a gate of the second transistor be electrically connected to one of a source and a drain of the first transistor, and the semiconductor device have a function of retaining a potential corresponding to the sensor signal when the first transistor is turned off.

In one embodiment of the present invention, it is preferable that the second and third transistors function as a source follower circuit in the semiconductor device.

In one embodiment of the present invention, it is preferable that the fourth transistor function as a selection switch in the second selection circuit in the semiconductor device.

In one embodiment of the present invention, it is preferable that a photodetector circuit and a power supply control circuit be included, and the power supply control circuit perform a control so that the sensor and the first selection circuit are operated intermittently, in accordance with an output signal of the photodetector circuit in the semiconductor device.

Note that other embodiments of the present invention will be shown in the description of the following embodiments and the drawings.

Effect of the Invention

According to one embodiment of the present invention, it is possible to provide a semiconductor device with a novel structure that is a semiconductor device functioning as a sensor-equipped signal processing device provided with a battery, in which long time driving can be achieved even under an environment with a low charging frequency of the battery. According to one embodiment of the present invention, it is possible to provide a semiconductor device with a novel structure, which can retain a signal of the sensor as an analog voltage even under an environment with a large variation of the outside temperature. According to one embodiment of the present invention, it is possible to provide a novel semiconductor device and the like Note that the description of the effects does not preclude the existence of other effects. In one embodiment of the present invention, there is no need to achieve all these effects. Note that effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 12A and FIG. 12B are block diagrams illustrating operation of a semiconductor device.

MODE FOR CARRYING OUT THE INVENTION

Figure 1A:
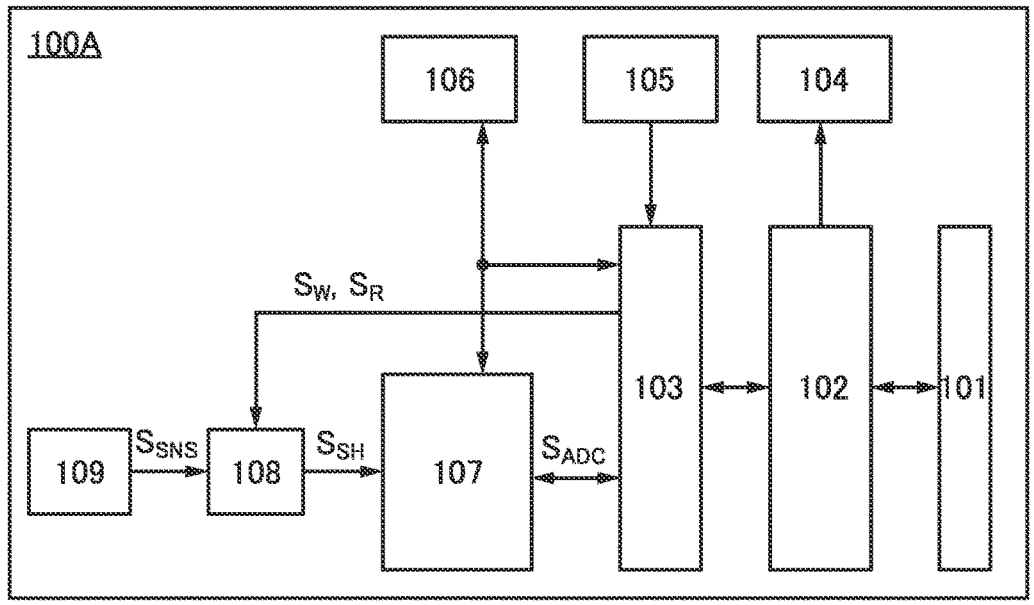
FIG. 1A, FIG. 1B, and FIG. 1C are block diagrams and a circuit diagram illustrating the structure of a semiconductor device.

Embodiments will be described below with reference to the drawings. Note that the embodiments can be implemented with many different modes, and it is readily appreciated by those skilled in the art that modes and details can be changed in various ways without departing from the spirit and scope of the present invention. Thus, the present invention should not be interpreted as being limited to the following description of the embodiments.

Note that ordinal numbers such as "first," "second," and "third" in this specification and the like are used in order to avoid confusion among components. Thus, the ordinal numbers do not limit the number of components. In addition, the ordinal numbers do not limit the order of components. Furthermore, in this specification and the like, for example, a "first" component in one embodiment can be referred to as a "second" component in other embodiments or claims. Moreover, in this specification and the like, for example, a "first" component in one embodiment can be omitted in other embodiments or claims.

Note that in the drawings, the same elements, elements having similar functions, elements formed of the same material, elements formed at the same time, or the like are sometimes denoted by the same reference numerals, and repeated description thereof is omitted in some cases.

Embodiment 1

The structure and operation of a semiconductor device of one embodiment of the present invention will be described with reference to FIG. 1A to FIG. 9B.

The semiconductor device of one embodiment of the present invention is provided with an antenna, a battery, a control circuit, a sample-and-hold circuit, an A/D converter circuit, and a sensor. In a period during which power is not supplied from the outside by a wireless signal such as an RF (Radio Frequency) signal, power accumulated in the battery is assigned to driving of the sensor and the sample-and-hold circuit, and driving of a circuit with a large power consumption, such as the A/D converter circuit, is stopped. In the period during which power is not supplied from the outside, the sensor and the sample-and-hold circuit obtain signals periodically by using the power of the battery and the signals are retained as analog voltages. In the period, the signals are retained in the sample-and-hold circuit including a transistor (OS transistor) in which a channel formation region includes an oxide semiconductor (OS).

The OS transistor has an extremely low off-state current and has a small variation in the characteristics due to temperature as compared to a transistor including silicon in a semiconductor layer (a Si transistor); therefore, sensor signals obtained by periodic sensing can be retained as analog voltages even under an environment with a large change in the environmental temperature. In a period during which power is supplied from the outside, the analog voltages retained in the sample-and-hold circuit are subjected to A/D conversion successively with the power supplied from the outside and retained in a memory circuit or output to a higher-level device.

The A/D converter circuit is stopped and sampling operation of the sensor signals continues when power is not supplied from the outside, and the A/D converter circuit is operated and A/D conversion of the retained analog voltages is performed when power is supplied from the outside, so that periodic acquisition of sensing data and a reduction in the power consumption can both be achieved.

FIG. 1A illustrates a semiconductor device 100A for describing one embodiment of the present invention. The semiconductor device 100A, for example, includes an antenna 101, a transmitting/receiving circuit 102, a control circuit 103, a battery 104, a timer circuit 105, a memory circuit 106, an A/D converter circuit 107, a sample-and-hold circuit 108, and a sensor 109.

The antenna 101 has a structure capable of signal transmission with a wireless signal such as an RF signal and power supply without contact. As a signal transmission method, an electromagnetic coupling method, an electromagnetic induction method, or a microwave method can be used. The shape, length, and the like of the antenna are set as appropriate in consideration of the transmission method, the wavelength, and the like of the signal.

The transmitting/receiving circuit 102 is a circuit for performing transmission and reception of the wireless signal in the antenna 101 and rectification and smoothing of the signal obtained by noncontact power supply. The transmitting/receiving circuit 102 includes, for example, a rectifier circuit, a modulation circuit, a demodulation circuit, an oscillator circuit, a constant-voltage circuit (regulator), and the like.

The control circuit 103 is a circuit for outputting data stored in the memory circuit 106 to the transmitting/receiving circuit 102 on the basis of a signal input from the transmitting/receiving circuit 102. The control circuit 103 is a circuit for storing a signal $S_{ADC}$ from the A/D converter circuit 107 in the memory circuit 106 on the basis of a signal input from the transmitting/receiving circuit 102. The control circuit 103 is a circuit for outputting signals $S_W$ and $S_R$ for controlling the sample-and-hold circuit 108, on the basis of a signal output from the timer circuit 105 or a signal input from the transmitting/receiving circuit 102.

For example, a lithium battery, a lithium polymer battery, a lithium ion battery, a nickel-hydride battery, a nickel-cadmium battery, an organic radical battery, a lead-acid battery, an air secondary battery, a nickel-zinc battery, a silver-zinc battery, or a capacitor can be used as the battery 104.

The timer circuit 105 is a circuit for measuring time. The control circuit 103 can output the signals $S_W$ and $S_R$ for controlling the sample-and-hold circuit 108 in accordance with the measurement time of the timer circuit 105. It is preferable to provide a power supply control circuit that performs power gating or intermittent operation of the memory circuit 106, the A/D converter circuit 107, the sample-and-hold circuit 108, and the sensor 109 in response to an output signal of the timer circuit 105. The structure makes it possible to set a period during which supply of a power supply voltage is interrupted, so that power consumption can be reduced.

The memory circuit 106 is a circuit for storing the signal $S_{ADC}$ from the A/D converter circuit 107. For example, a nonvolatile memory such as an ReRAM (Resistive Random Access Memory), a PRAM (Phase change Random Access Memory), an FeRAM (Ferroelectric Random Access Memory), or an MRAM (Magnetoresistive Random Access Memory), or a flash memory may be included as a memory element included in the memory circuit. In addition, a memory including an OS transistor may be included.

The A/D converter circuit 107 is a circuit for converting a signal $S_{SH}$ of an analog voltage into a digital signal $S_{ADC}$. The A/D converter circuit 107 is freely selected from, for example, a parallel-approximation-type A/D converter circuit, a pipeline-type A/D converter circuit, a successive-approximation-type A/D converter circuit, a delta-sigma-type A/D converter circuit, and a double-integrating-type A/D converter circuit.

As the sensor 109, a variety of sensors that monitor the environment (e.g., an optical sensor, a thermal sensor, a humidity sensor, a gas sensor, an odor sensor, a vibration sensor, an acceleration sensor, and a distortion sensor), a variety of biological sensors, and the like can be used. In such a sensor-equipped semiconductor device illustrated in FIG. 1A, power is supplied by a wireless signal. It is assumed that a chip is embedded in a structure or a human body and measurement is performed by the sensor periodically; therefore, one or a plurality of sensors appropriate for the purpose are preferably used.

Figure 1B:
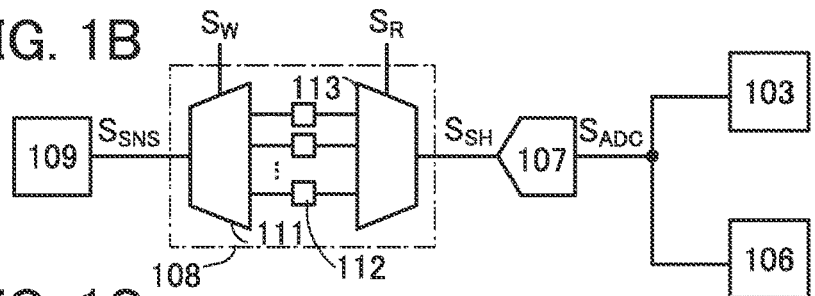

FIG. 1B illustrates the structure of the sample-and-hold circuit 108. The sample-and-hold circuit 108 includes a selection circuit 111, a plurality of signal retention circuits 112, and a selection circuit 113.

The selection circuit 111 (also referred to as a first selection circuit) has a function of a demultiplexer that distributes signals $S_{SNS}$ output by the sensor 109 to the plurality of signal retention circuits 112. A transistor included in the selection circuit 111 has a function of a switch, and the on/off of the transistor is controlled by the signal $S_W$. The selection circuit 111 is formed using an n-channel transistor, for example. In this case, the transistor included in the selection circuit 111 is turned on when an H-level potential is input to the gate and turned off when an L-level potential is input to the gate.

The plurality of signal retention circuits 112 have a function of retaining analog voltages corresponding to the signals $S_{SNS}$ output from the sensor 109 and outputting voltages corresponding to the analog voltages. The switch included in the selection circuit 111 is turned on at a predetermined time and the signal $S_{SNS}$ is sampled, whereby the analog voltage output by the sensor 109 is written to the signal retention circuit 112 at a predetermined time. The writing of the analog voltage to the signal retention circuit 112 can be controlled by setting the signal $S_W$ to an H level. The retention of the analog voltage in the signal retention circuit 112 can be controlled by setting the signal $S_W$ to an L level.

Note that, an analog voltage based on the signal $S_{SNS}$ at the time when the signal $S_W$ is set to an H level is written to each of the plurality of signal retention circuits 112 at different times. Then, the analog voltage is retained when the signal $S_W$ is set to an L level. That is, the plurality of signal retention circuits 112 can obtain the signals $S_{SNS}$ output by the sensor 109 at different times and can retain voltages corresponding to the signals $S_{SNS}$. Thus, in the plurality of signal retention circuits 112, sampling of the signal $S_{SNS}$ is performed successively, whereby an analog voltage based on the signal $S_{SNS}$ output from the sensor 109 can be obtained at a predetermined time and retained.

In addition, the plurality of signal retention circuits 112 have a function of amplifying and outputting the retained analog voltage. For example, the plurality of signal retention circuits 112 each include a source follower circuit and each have a function of outputting a voltage corresponding to the retained analog voltage through the source follower circuit or the like.

The selection circuit 113 (also referred to as a second selection circuit) has a function of a multiplexer that selects any one of the analog voltages retained in the plurality of signal retention circuits 112 and outputting it at different times. A transistor included in the selection circuit 113 has a function of a switch, and the on/off of the transistor is controlled by the signal $S_R$. The selection circuit 113 is formed using an n-channel transistor, for example. In this case, the transistor included in the selection circuit 113 is turned on when an H-level potential is input to the gate and turned off when an L-level potential is input to the gate.

The selection circuit 113 selects any one of the signal retention circuits 112 and outputs a voltage corresponding to the analog voltage retained in the signal retention circuit 112, as the signal $S_{SH}$. The signal $S_{SH}$ is a signal corresponding to any one of the signals $S_{SNS}$ that have been sampled at the predetermined times and output from the sensor 109. In other words, in the selection circuit 113, the signal $S_R$ is selected, whereby the signal $S_{SNS}$ sampled at the predetermined time can be selectively output as the signal $S_{SH}$.

Figure 1C:
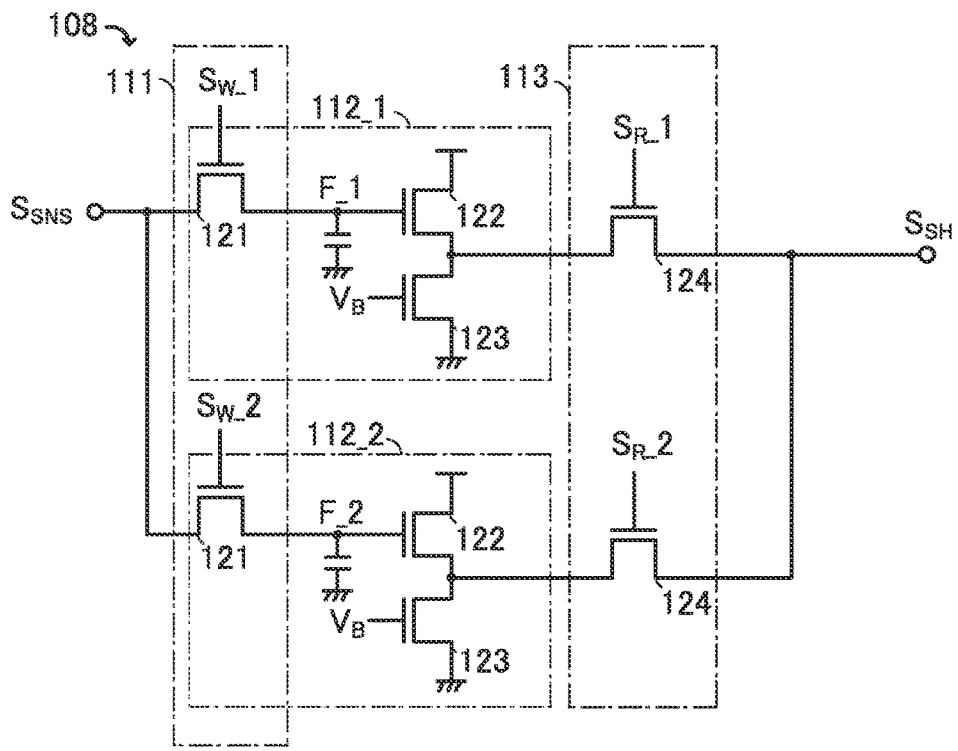

FIG. 1C illustrates a structure example of a specific circuit diagram of the sample-and-hold circuit 108 including two signal retention circuits 112. The sample-and-hold circuit 108 in FIG. 1C includes transistors 121 to 124.

Note that when it is unnecessary to specify one of the signal retention circuits 112, the reference numeral of the signal retention circuit 112 is used; when a certain signal retention circuit 112 is described, a reference numeral such as a signal retention circuit 112_1 or a signal retention circuit 112_2 is used. The same applies to other elements, and reference numerals to which "_2", "[1]", and the like are added are used to distinguish a plurality of elements from each other.

FIG. 1C illustrates the transistors 121 included in the selection circuit 111, the transistors 121, the transistors 122, and the transistors 123 included in the signal retention circuits 112, and the transistors 124 included in the selector circuit 113. The transistors 121 to 124 are n-channel transistors.

FIG. 1C illustrates a signal $S_{W\_1}$ and a signal $S_{W\_2}$ as the signals $S_W$. The signal $S_{W\_1}$ and the signal $S_{W\_2}$ are signals for sampling the signals $S_{SNS}$ at different times.

FIG. 1C illustrates nodes F_1 and F_2 that retain analog voltages sampled in the selection circuit 111. In addition, in FIG. 1C, the nodes F_1 and F_2 are connected to gates of the transistors 122, which are input terminals of the source follower circuits. Furthermore, bias voltages $V_B$ of the source follower circuits are applied to gates of the transistors 123. Note that although capacitors are connected to the nodes F_1 and F_2 in the diagram, they can be omitted when a sufficiently large gate capacitance of the transistor 122 is secured, for example. The source follower circuit enables an increase in the charge supply capability to the selection circuit 113 in the subsequent stage. Moreover, the OS transistor has a small variation in the transistor electrical characteristics against a change in the environmental temperature. Therefore, the use of the OS transistor in the source follower circuit makes it possible to reduce leakage current that flows under an environment with a large change in the outside temperature.

FIG. 1C illustrates a signal $S_{R\_1}$ and a signal $S_{R\_2}$ as the signals $S_R$ input to the selection circuit 113. With the signal $S_{R\_1}$ and the signal $S_{R\_2}$, the voltages of the nodes F_1 and F_2 corresponding to the sampled analog voltages are selected and output, whereby the signal $S_{SH}$ corresponding to the signal $S_{SNS}$ sampled at a predetermined time can be output.

The transistors 121 to 124 are OS transistors. With the use of OS transistors as the transistors included in the sample-and-hold circuit 108, the analog voltage obtained by sampling of the signal $S_{SNS}$ output by the sensor 109 can be retained in the signal retention circuit 112 thanks to an extremely low leakage current (hereinafter referred to as off-state current) flowing between a source and a drain at the time when the transistor is off. Therefore, even with a structure in which after the analog voltage is obtained, the analog voltage is retained as it is without A/D conversion and then read out, a highly precise output signal can be obtained, and the power consumption of the battery 104 can be reduced in a period without power supply by a wireless signal.

In addition, the signal retention circuit 112 including the OS transistors can rewrite and read the analog voltage by charging or discharging electric charge; thus, a substantially unlimited number of times of obtaining and reading of the analog voltage is possible. The signal retention circuit including OS transistors is superior in rewrite endurance because, unlike a magnetic memory or a resistive random-access memory, it does not go through atomic-level structure change. Moreover, in the signal retention circuit including OS transistors, instability due to an increase of electron trap centers, which is observed in a flash memory, is not observed even when rewrite operation is repeated.

Furthermore, the signal retention circuit including OS transistors can freely be placed, for example, over a circuit including an Si transistor, so that integration can be easy even with a structure including a plurality of delay circuits. Furthermore, OS transistors can be manufactured using a manufacturing apparatus similar to that for Si transistors and thus can be manufactured at low cost.

In addition, when an OS transistor has a back gate electrode in addition to a gate electrode, a source electrode, and a drain electrode, the OS transistor can be a four-terminal semiconductor element. The OS transistor can be formed using an electric circuit network that can independently control input and output of signals flowing between a source and a drain depending on a voltage applied to the gate electrode or the back gate electrode. Therefore, it is possible to design circuits under the same thought as LSI. Furthermore, electrical characteristics of the OS transistor are better than those of a Si transistor in a high-temperature environment. Specifically, the ratio between an on-state current and an off-state current is large even at a high temperature higher than or equal to 125° C. and lower than or equal to 150° C.; thus, favorable switching operation can be performed.

Figure 2:
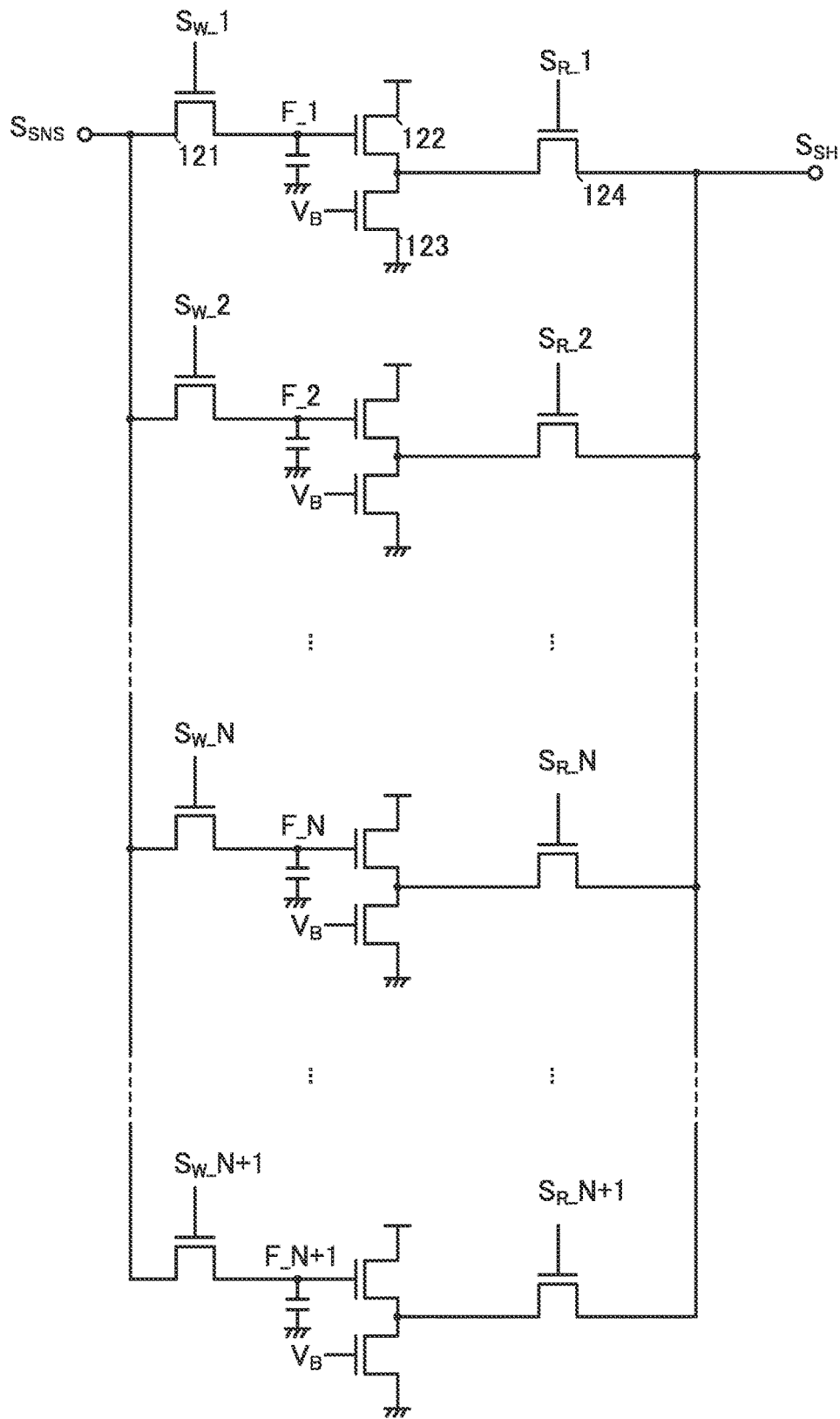
FIG. 2 is a circuit diagram illustrating the structure of a semiconductor device.

Note that although the signal retention circuits 112_1 and 112_2 are illustrated in FIG. 1C as the signal retention circuit 112, they can be shown as in FIG. 2. The signal retention circuit 112 included in the sample-and-hold circuit 108 in FIG. 2 includes signal retention circuits 112_1 to 112_N+1 (N is a natural number of 2 or more), for example.

FIG. 2 illustrates a structure example of the sample-and-hold circuit 108 in which the signals $S_W$ for sampling the signals $S_{SNS}$ are signals $S_{W\_1}$ to $S_{W\_N+1}$, nodes for retaining analog voltages are nodes F_1 to F_N+1, and the signals $S_R$ for reading the plurality of retained analog voltages as the signals $S_{SH}$ sequentially are a signal $S_{R\_1}$ to a signal $S_{R\_N+1}$. The sample-and-hold circuit illustrated in FIG. 2 has a structure in which the signals $S_{SNS}$ are sampled at N different times, an analog voltage is retained in each of the signal retention circuits 112, and an output signal corresponding to the analog voltage retained in each of the signal retention circuits 112 is output at the N different times.

Figure 3:
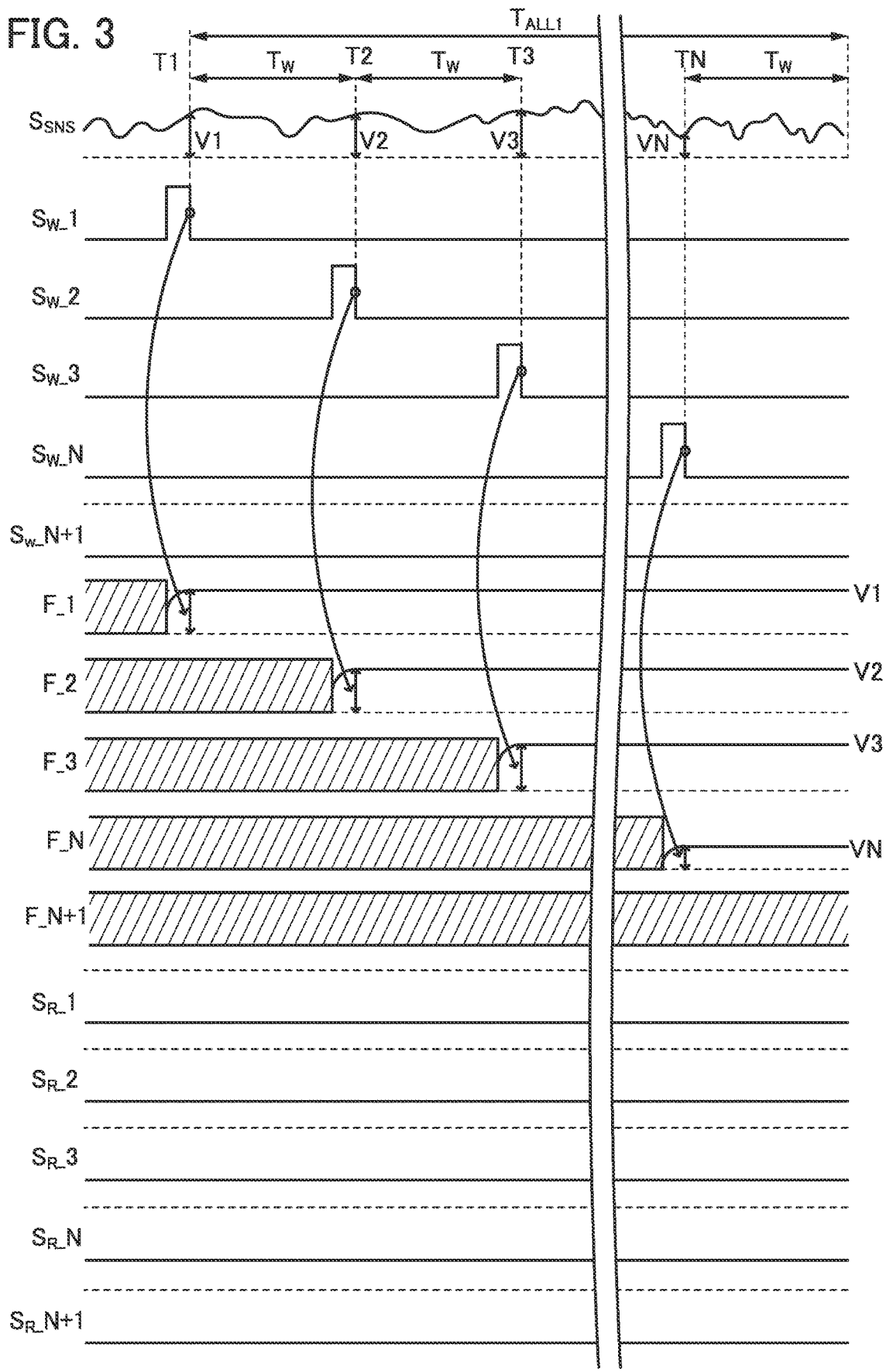
FIG. 3 is a timing chart illustrating operation of a semiconductor device.

FIG. 3 is a timing chart for describing an operation of sampling the signal $S_{SNS}$ in the sample-and-hold circuit 108 in FIG. 2. FIG. 3 shows the signal $S_{W\_1}$ to the signal $S_{W\_3}$, the signal $S_{W\_N}$, the signal $S_{W\_N+1}$, the nodes F_1 to F_3, the nodes F_N and F_N+1, the signal $S_{R\_1}$ to the signal $S_{R\_3}$, the signal $S_{R\_N}$, and the signal $S_{R\_N+1}$, together with the waveform of the signal $S_{SNS}$. Operation from time T1 to time TN is described with reference to FIG. 3. Note that a period with hatching indicates a period showing an instable state in the diagram for describing the timing chart.

At the time T1, the signal $S_{W\_1}$ is set to an H level and a voltage V1 of the signal $S_{SNS}$ is written to the node F_1, whereby sampling of the signal $S_{SNS}$ is performed, as described above.

At the time T2 after the elapse of a period $T_W$, the signal $S_{W\_2}$ is set to an H level, and a voltage V2 of the signal $S_{SNS}$ is written to the node F_2, whereby sampling of the signal $S_{SNS}$ is performed.

Similarly, at the time T3 after the elapse of the period $T_W$, the signal $S_{W\_3}$ is set to an H level, and a voltage V3 of the signal $S_{SNS}$ is written to the node F_3, whereby sampling of the signal $S_{SNS}$ is performed. At the time TN, the signal $S_{W\_N}$ is set to an H level, and a voltage VN of the signal $S_{SNS}$ is written to the node F_N, whereby sampling of the signal $S_{SNS}$ is performed. The voltages V1 to VN retained in the node F_1 to the node F_N can be retained when the signals $S_{W\_1}$ to $S_{W\_N}$ are set to an L level.

The above-described N times of sampling, which are executed by setting the signals $S_{W\_1}$ to $S_{W\_N}$ an H level successively, are performed within a period $T_{ALL1}$. The periods $T_W$ and $T_{ALL1}$ are preferably set in accordance with the capacity or charging frequency of the battery. For example, the period $T_W$ is preferably set short in the case where the battery capacity is large or the charging frequency is high; in contrast, the period $T_W$ is preferably set long in the case where the battery capacity is small or the charging frequency is low. The N times of sampling are performed in the period $T_{ALL1}$.

The signal $S_{R\_1}$ to the signal $S_{R\_3}$, the signal $S_{R\_N}$, and the signal $S_{R\_N+1}$ are kept at an L level during the period $T_{ALL1}$. The signal $S_{W\_N+1}$ is also controlled to be kept at an L level so that the signal $S_{SH}$ is not output. The operation makes it possible to inhibit an increase in power consumption due to output of the signal $S_{SH}$ in a period in which the signal $S_{SNS}$ output by the sensor 109 is sampled.

Figure 4:
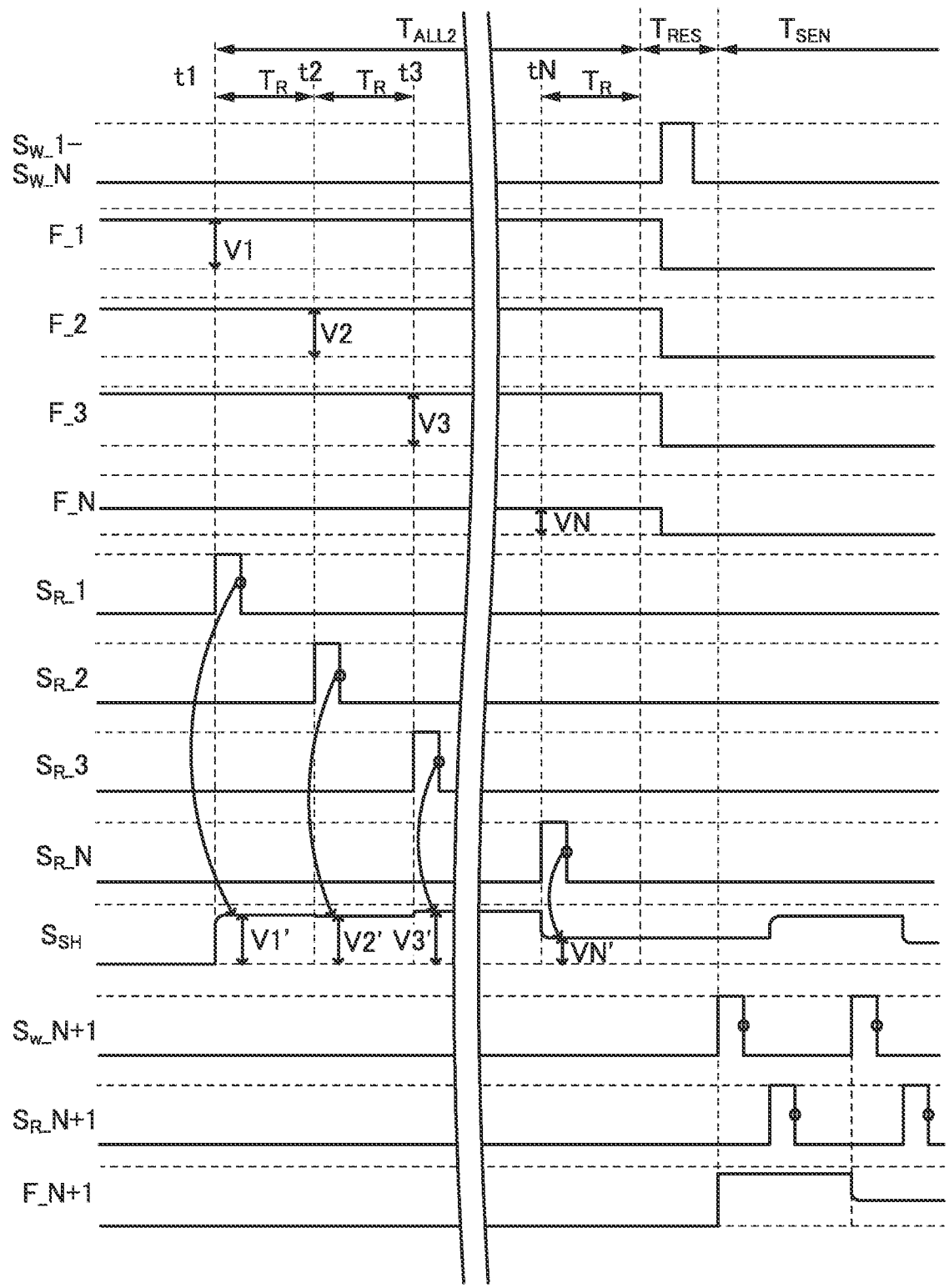
FIG. 4 is a timing chart illustrating operation of a semiconductor device.

FIG. 4 is a timing chart for describing an operation of outputting the voltages V1 to VN retained in the sample-and-hold circuit 108 in FIG. 2, as the signals $S_{SH}$. FIG. 4 shows operation of the signal $S_{W\_1}$ to the signal $S_{W\_N+1}$, the nodes F_1 to F_3, the nodes F_N and F_N+1, the signal $S_{R\_1}$ to the signal $S_{R\_3}$, the signal $S_{R\_N}$, the signal $S_{R\_N+1}$, and the signal $S_{SH}$ from time t1 to tN.

At the time t1, the signal $S_{R\_1}$ is set to an H level, and a voltage V1' corresponding to the voltage V1 of the node F_1 is output as the signal $S_{SH}$. Note that after the signal $S_{SH}$ corresponding to the voltage V1 is output from the sample-and-hold circuit 108, the signal $S_{R\_1}$ is controlled to be set to an L level so that the signal $S_{SH}$ is not output. Although the signal $S_{SH}$ is not changed after the signals $S_{R\_1}$ to $S_{R\_N}$ are changed from an H level to an L level in FIG. 4, the signal $S_{SH}$ may be changed to another potential after A/D conversion of the signal $S_{SH}$ in the A/D converter circuit 107.

At the time t2 after the elapse of a period $T_R$, the signal $S_{R\_2}$ is set to an H level, and a voltage V2' corresponding to the voltage V2 of the node F_2 is output as the signal $S_{SH}$. Note that after the signal $S_{SH}$ corresponding to the voltage V2 is output from the sample-and-hold circuit 108, the signal $S_{R\_2}$ is controlled to be set to an L level so that the signal $S_{SH}$ is not output.

Similarly, at the time t3 after the elapse of the period $T_R$, the signal $S_{R\_3}$ is set to H an level, and a voltage V3' corresponding to the voltage V3 of the node F_3 is output as the signal $S_{SH}$. Note that after the signal $S_{SH}$ corresponding to the voltage V3 is output from the sample-and-hold circuit 108, the signal $S_{R\_3}$ is controlled to be set to an L level so that the signal $S_{SH}$ is not output. At the time tN, the signal $S_{R\_N}$ is set to an H level, and a voltage VN' corresponding to the voltage VN of the node F_N is output as the signal $S_{SH}$. Note that after the signal $S_{SH}$ corresponding to the voltage VN is output from the sample-and-hold circuit 108, the signal $S_R\_N$ is controlled to be set to an L level so that the signal $S_{SH}$ is not output.

The above-described N times of output of signals, which are executed by setting the signals $S_R\_1$ to $S_R\_N$ to an H level successively, are performed in a period $T_{ALL2}$. The period $T_R$ and the period $T_{ALL2}$ are preferably set in accordance with the length of a period during which charge is performed. Furthermore, the period $T_{ALL2}$ is preferably shorter than the period $T_{ALL1}$; in other words, the period $T_R$ is preferably shorter than the period $T_W$. When the period $T_R$ and the period $T_{ALL2}$ are set to short periods, output of the signals $S_{SH}$ can be performed within the period during which charge is performed from the outside.

A period $T_{RES}$ for initializing the potentials of the nodes F_1 to F_N is preferably provided after the period $T_{ALL2}$. In the period $T_{RES}$, the output of the sensor 109 is set to a reset voltage (e.g., a ground potential) and the signal $S_{W\_1}$ to the signal $S_{W\_N}$ are set to an H level, whereby the charge retained in the nodes F_1 to F_N can be released.

Note that in the case where charge is performed from the outside, a period after the period $T_{RES}$ until a time at which charge from the outside is stopped is a period $T_{SEN}$ in which sampling and reading of the signal $S_{SNS}$ are alternately performed. In the period $T_{SEN}$, for example, the signal $S_{W\_N+1}$ and the signal $S_{R\_N+1}$ are alternately set to an H level and the node F_N+1 is updated, so that the output of the signal $S_{SH}$ is obtained.

The operation shown in FIG. 3 and FIG. 4 can be performed, whereby when a power supply device for charging does not exist by the antenna, that is, when the semiconductor device 100A is driven with power accumulated in the battery, the semiconductor device 100A of one embodiment of the present invention performs an operation of consuming the power of the battery for driving of the sensor and for an operation for sampling analog voltages obtained from the sensor. Meanwhile, the semiconductor device 100A performs an operation of bringing the other circuits such as the A/D converter circuit into a stop state.

The operation of the above structure can be illustrated with block diagrams in FIG. 5A, FIG. 6A, FIG. 6B, and FIG. 6C. In each of the block diagrams in FIG. 5A, FIG. 6A, FIG. 6B, and FIG. 6C, structures that are in a stop state or do not function are shown by dotted lines, and structures that function in an operation state are shown by solid lines.

Figure 5A:
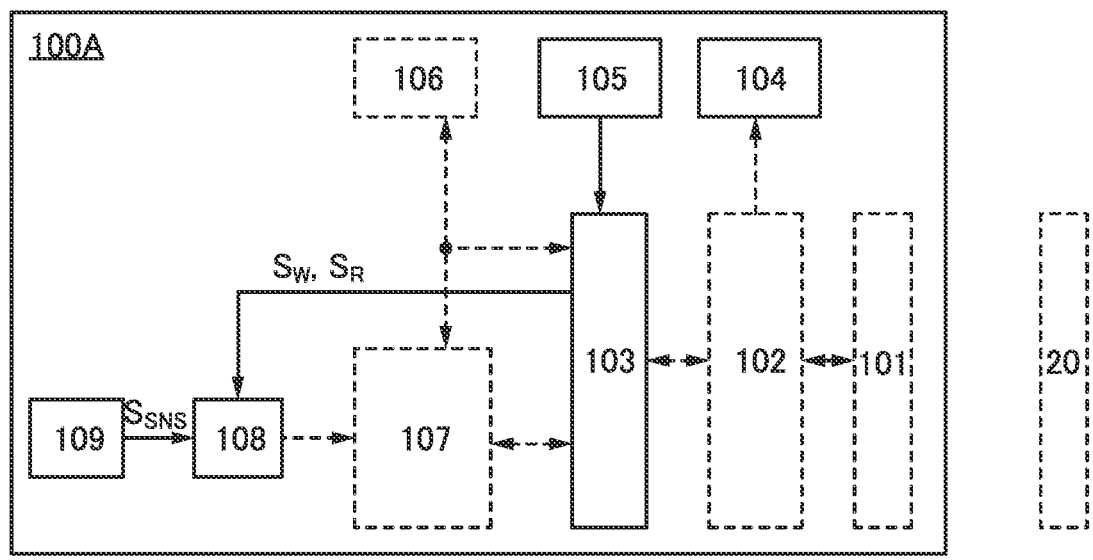
FIG. 5A and FIG. 5B are block diagrams illustrating operation of a semiconductor device.

A block diagram of the semiconductor device 100A in FIG. 5A illustrates a state in which only necessary circuits are driven with the power accumulated in the battery 104. Such a structure enables a reduction in the power consumption of the circuits in the semiconductor device 100A that are in a stop state or do not function and extension of the driving time by the battery. When a power supply device 20 does not operate (shown by a dotted line in the diagram), the semiconductor device 100A operates with the power accumulated in the battery 104. Specifically, the power of the battery 104 is supplied to the control circuit 103, the battery 104, the timer circuit 105, the sample-and-hold circuit 108, and the sensor 109 (each of which is illustrated by a solid line). In contrast, when the power supply device 20 does not operate, the power of the battery 104 is not supplied to circuits such as the antenna 101, the transmitting/receiving circuit 102, the memory circuit 106, and the A/D converter circuit 107 (each of which is shown by a dotted line).

Figure 6A:
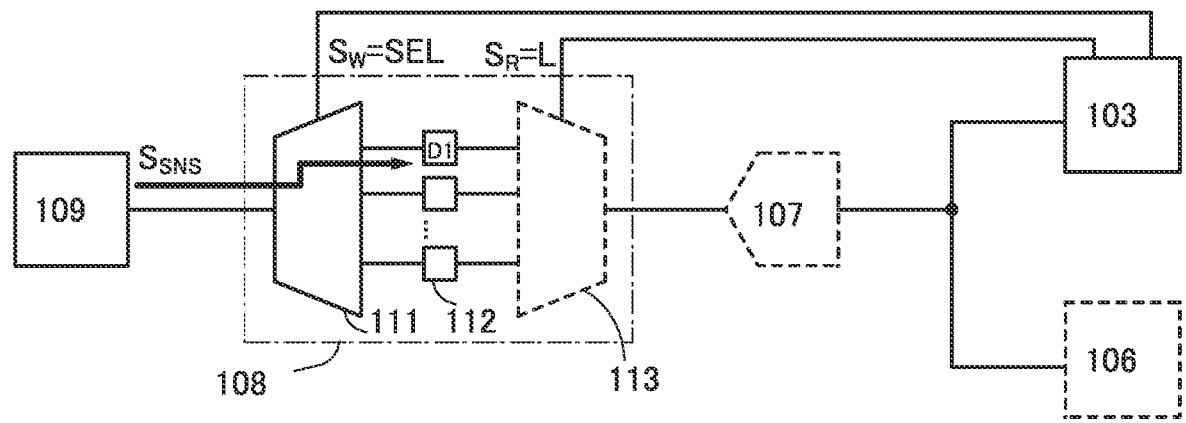
FIG. 6A, FIG. 6B, and FIG. 6C are block diagrams illustrating operation of a semiconductor device.
Figure 6B:
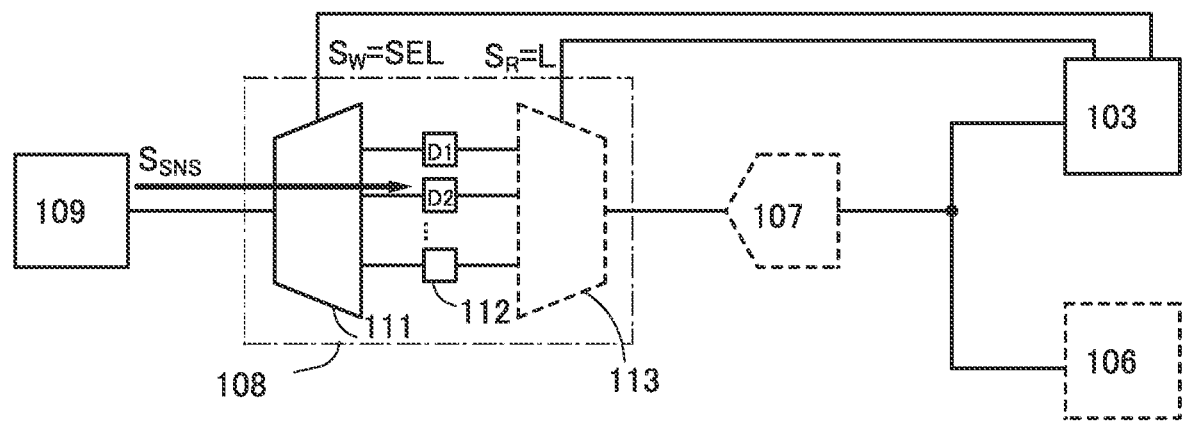
Figure 6C:
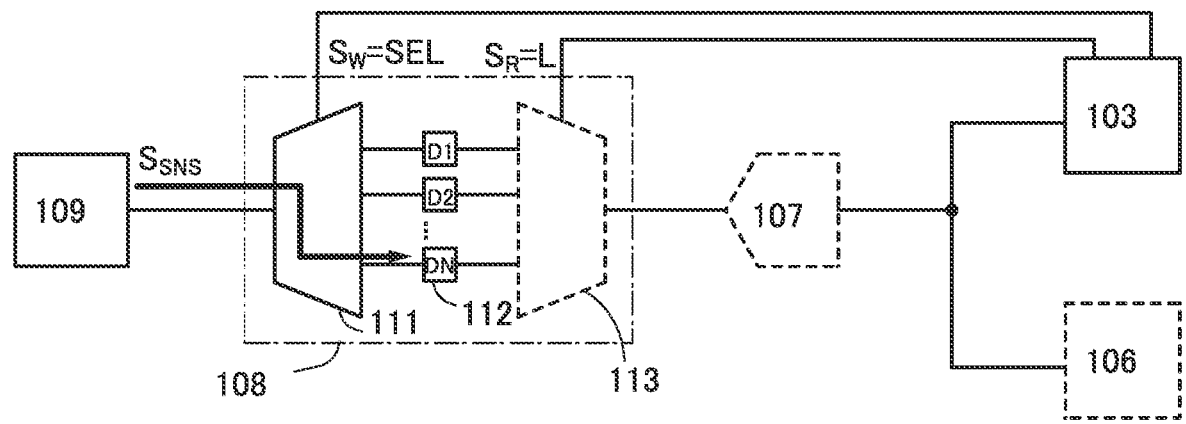

FIG. 6A, FIG. 6B, and FIG. 6C are diagrams for describing the operation of the semiconductor device 100A in FIG. 5A. FIG. 6A illustrates a state in which the selection circuit 111 is controlled by the signal $S_W$ of the control circuit 103 (=SEL), so that a signal of the signal $S_{SNS}$ is retained as a voltage D1 in one of the signal retention circuits 112. Note that a bold arrow in FIG. 6A shows the flow of the signal. In FIG. 6A, the selection circuit 113 is deselected by the signal $S_R$ of the control circuit 103 (=L), so that the signal $S_{SH}$ is not output. Therefore, stop of power supply (power gating) to the circuits such as the A/D converter circuit 107 and the memory circuit 106 can be performed. As a result, the power consumption of the battery can be reduced.

Similarly to FIG. 6A, FIG. 6B illustrates a state in which the selection circuit 111 is controlled by the signal $S_W$ of the control circuit 103 (=SEL), so that a signal of the signal $S_{SNS}$ is retained as a voltage D2 in a different signal retention circuit 112 from that in the case of FIG. 6A. As illustrated in FIG. 6B, the voltage D1 which has been sampled in FIG. 6A continues to be retained by the control of the signal $S_W$, as described above. In FIG. 6B, the selection circuit 113 is deselected by the signal $S_R$ of the control circuit 103 (=L), so that the signal $S_{SH}$ is not output. Therefore, stop of power supply (power gating) to the circuits such as the A/D converter circuit 107 and the memory circuit 106 can be performed.

Similarly to FIG. 6A and FIG. 6B, FIG. 6C illustrates a state in which the selection circuit 111 is controlled by the signal $S_W$ of the control circuit 103 (=SEL), so that a signal of the signal $S_{SNS}$ is retained as a voltage DN in the different signal retention circuit 112 from those in the case of FIG. 6A and FIG. 6B. In addition, as illustrated in FIG. 6C, the voltages D1, D2, and the like which have been sampled in FIG. 6A and FIG. 6B continue to be retained by the control of the signal $S_W$, as described above. In FIG. 6C, the selection circuit 113 is deselected by the signal $S_R$ of the control circuit 103 (=L), so that the signal $S_{SH}$ is not output. Therefore, stop of power supply (power gating) to the circuits such as the A/D converter circuit 107 and the memory circuit 106 can be performed. The state of FIG. 6C corresponds to a state in which N times of sampling of the signals $S_{SNS}$ are performed, and the obtained voltages D1 to DN are retained in the plurality of signal retention circuits 112.

The operation illustrated in FIG. 3 and FIG. 4 can be performed, whereby when the power supply device for charging exists by the antenna, that is, when the semiconductor device 100A is driven with power from the outside, the semiconductor device 100A of one embodiment of the present invention performs an operation of consuming the power from the outside for the operation of the circuits such as the A/D converter circuit.

The operation of the above structure can be illustrated with block diagrams in FIG. 5B, FIG. 7A, FIG. 7B, FIG. 7C, and FIG. 8. FIG. 5B, FIG. 7A, FIG. 7B, FIG. 7C, and FIG. 8 are block diagrams in which structures that function in an operation state are shown by solid lines.

Figure 5B:
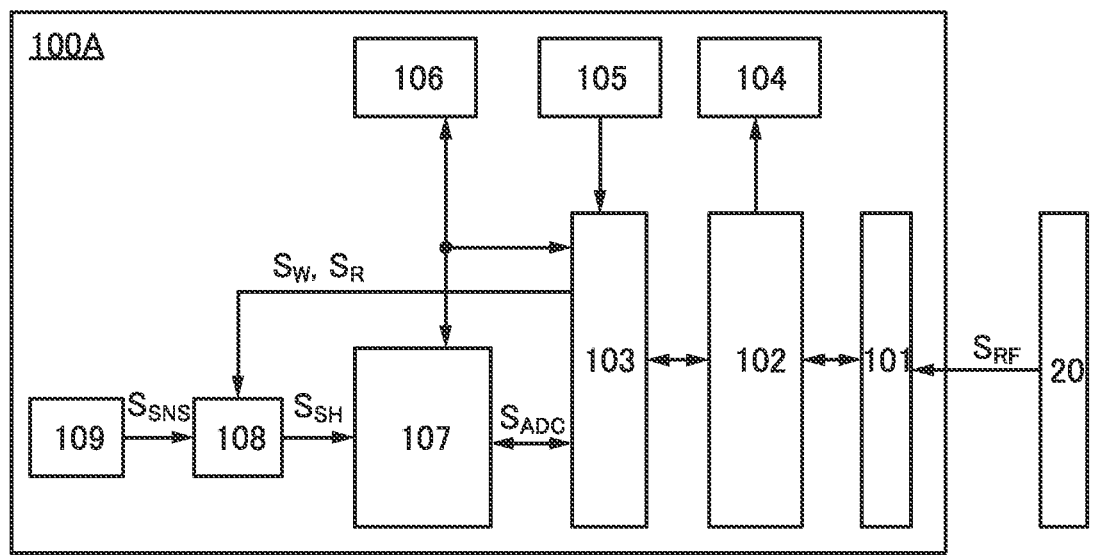

Operation of the semiconductor device 100A in FIG. 5B corresponds to operation in a period in which each circuit is driven with power supplied from the power supply device 20. The structure enables successive A/D conversion of the voltages D1 to DN retained in the signal retention circuits 112, writing of the signal $S_{ADC}$ obtained by the A/D conversion to the memory circuit 106, securing of power sufficient for sending through the antenna 101, and the like.

Figure 7A:
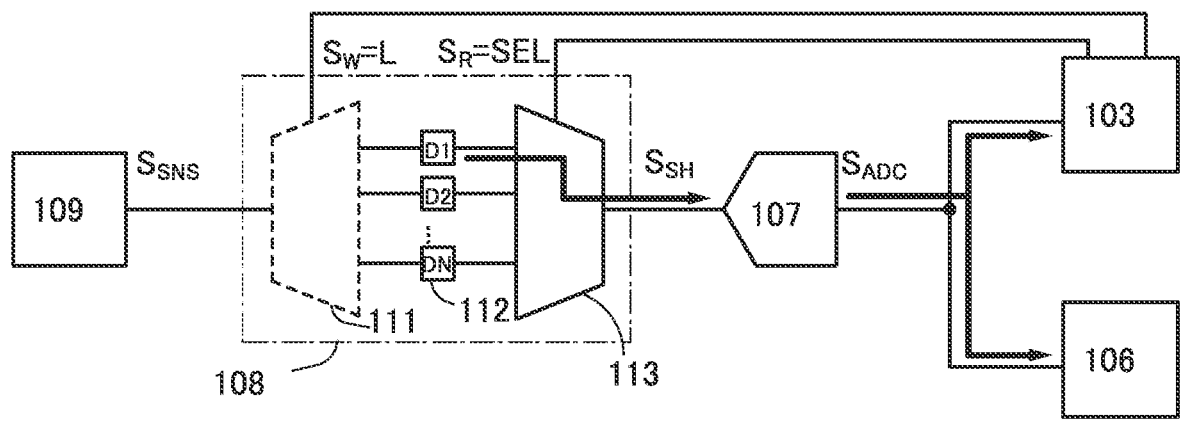
FIG. 7A, FIG. 7B, and FIG. 7C are block diagrams illustrating the structure of a semiconductor device.

FIG. 7A, FIG. 7B, FIG. 7C, and FIG. 8 are diagrams for describing the operation of the semiconductor device 100A in FIG. 5B. FIG. 7A illustrates a state in which the selection circuit 113 is controlled by the signal SR of the control circuit 103 (=SEL), so that the voltage D1 retained in one of the plurality of signal retention circuits 112 is read as the signal $S_{SH}$. Note that bold arrows in FIG. 7A show the flow of signals. In FIG. 7A, the selection circuit 111 is deselected by the signal $S_W$ of the control circuit 103 (=L), so that the signal $S_{SNS}$ is not sampled. Therefore, the voltages D1 to DN continue to be retained by the control of the signal $S_W$, as described above. The signal $S_{ADC}$, which is obtained by the A/D conversion of the voltages D1 to DN that have been accumulated when the A/D converter circuit 107 does not operate, is output to the control circuit 103 or the memory circuit 106.

Figure 7B:
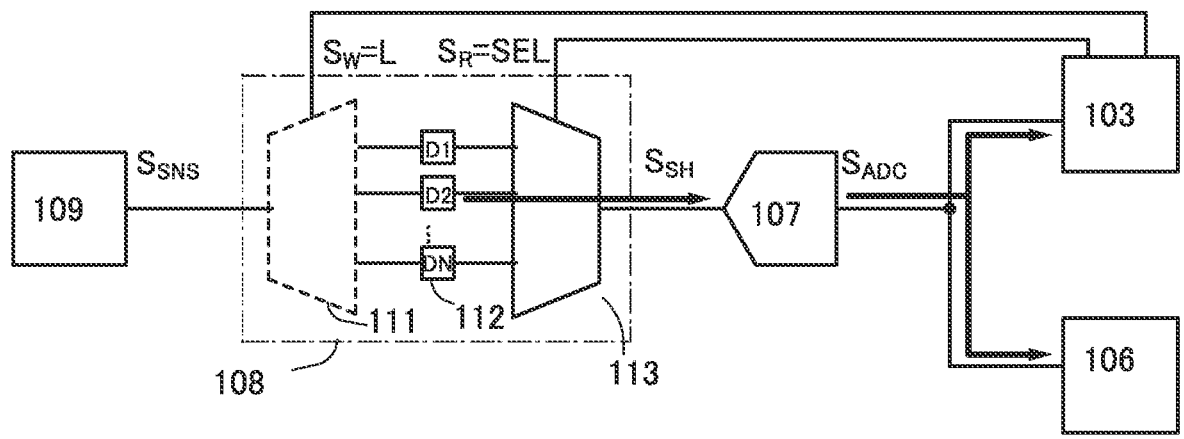

Similarly to FIG. 7A, FIG. 7B illustrates a state in which the selection circuit 113 is controlled by the signal $S_R$ of the control circuit 103 (=SEL), so that the voltage D2 retained in one of the plurality of signal retention circuits 112 is read as the signal $S_{SH}$. In FIG. 7B, the selection circuit 111 is deselected by the signal $S_W$ of the control circuit 103 (=L), so that the signal $S_{SNS}$ is not sampled. Therefore, the voltages D1 to DN continue to be retained by the control of the signal $S_W$, as described above.

Figure 7C:
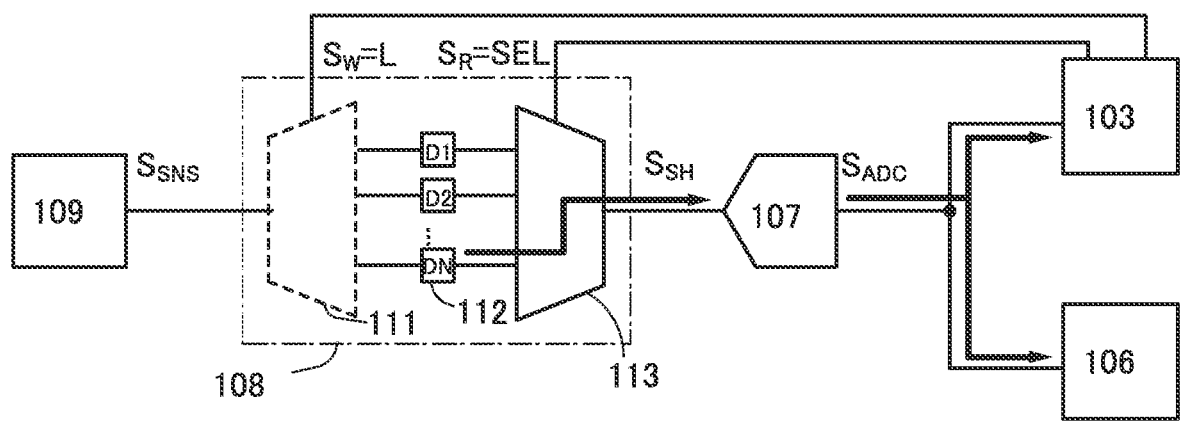
Figure 8:
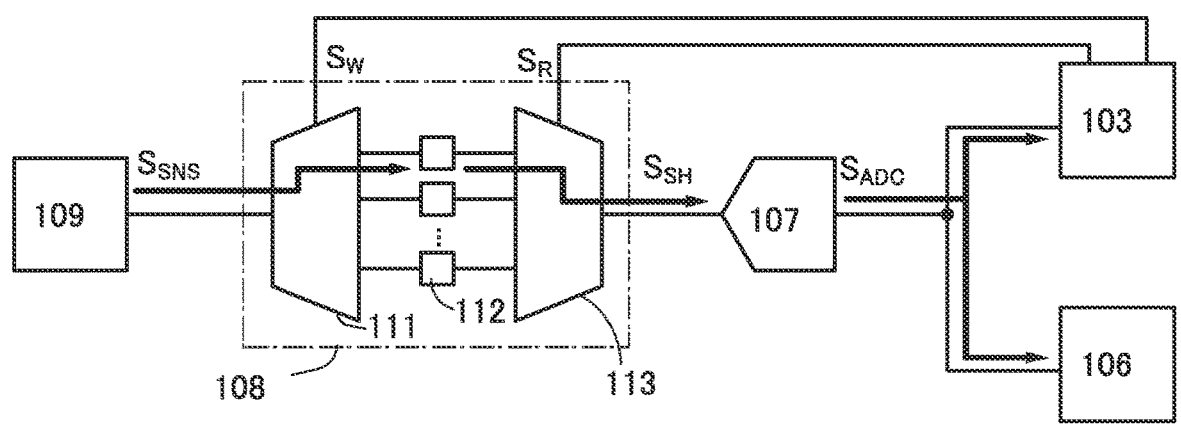
FIG. 8 is a block diagram illustrating the structure of a semiconductor device.

Similarly to FIG. 7A and FIG. 7B, FIG. 7C illustrates a state in which the selection circuit 113 is controlled by the signal $S_R$ of the control circuit 103 (=SEL), so that the voltage DN retained in one of the plurality of signal retention circuits 112 is read as the signal $S_{SH}$. In FIG. 7C, the selection circuit 111 is deselected by the signal $S_W$ of the control circuit 103 (=L), so that the signal $S_{SNS}$ is not sampled. Therefore, the voltages D1 to DN continue to be retained by the control of the signal $S_W$, as described above.

The block diagram of the semiconductor device 100A in FIG. 5B shows an operation of driving each circuit with power supplied from the power supply device 20. Thus, the semiconductor device 100A can have a structure in which sampling of the signal $S_{SNS}$ and output of the signal $S_{SH}$ are alternately performed to obtain the A/D converted signal $S_{ADC}$, as shown in a schematic diagram in FIG. 8.

Note that as for periodic sampling of the signal $S_{SNS}$ in a period without power supply by the power supply device, a control signal controls each circuit by using an output signal of the timer circuit 105 or the like. An example of power gating of the circuits is described with reference to FIG. 9A and FIG. 9B.

Figure 9A:
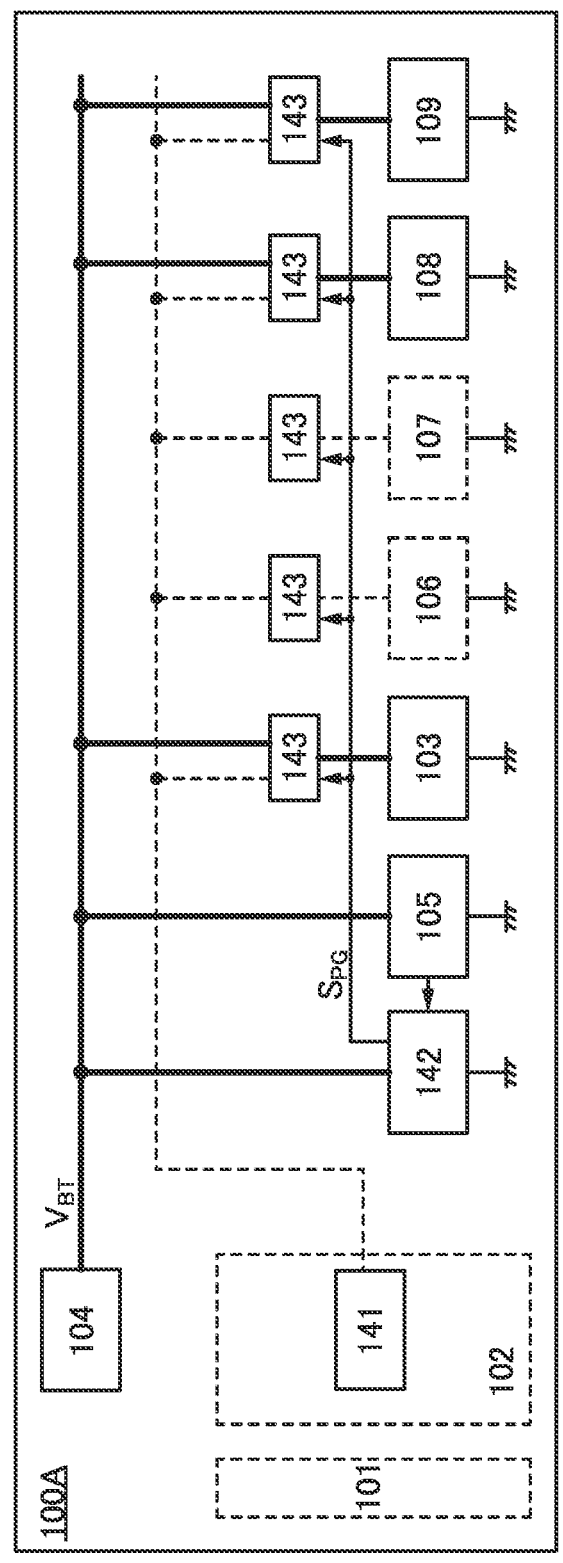
FIG. 9A and FIG. 9B are block diagrams illustrating the structure of a semiconductor device.

FIG. 9A illustrates the antenna 101, the transmitting/receiving circuit 102, the control circuit 103, the battery 104, the timer circuit 105, the memory circuit 106, the A/D converter circuit 107, the sample-and-hold circuit 108, and the sensor 109, which are illustrated in FIG. 1A; the power supply device 20; a power supply control circuit 142; and switches 143. In addition, FIG. 9A illustrates a constant voltage circuit 141 in the transmitting/receiving circuit 102.

FIG. 9A illustrates a state in which power supply by a wireless signal from the power supply device 20 to the semiconductor device 100A is not performed. In this state, a voltage VBT output by the battery 104 is supplied to the circuits in the semiconductor device 100A as described above. Bold solid lines in FIG. 9A show the state of supply of the voltage to the circuits. A voltage generated on the basis of a wireless signal is supplied to the circuits in the semiconductor device 100A; however, since there is no supply of a wireless signal in the state in FIG. 9A, dotted lines show a state in which no voltage is supplied to the circuits.

The power supply control circuit 142 outputs a signal $S_{PG}$ for controlling the switches 143 in accordance with the measurement time of the timer circuit 105. The signal $S_{PG}$ output by the power supply control circuit 142 controls the switches 143 so that the power of the battery 104 is supplied to the control circuit 103, the sample-and-hold circuit 108, and the sensor 109 (each of which is shown by a solid line) and is not supplied to the circuits such as the antenna 101, the transmitting/receiving circuit 102, the memory circuit 106, and A/D converter circuit 107 (each of which is shown by a dotted line) in FIG. 9A.

Figure 9B:
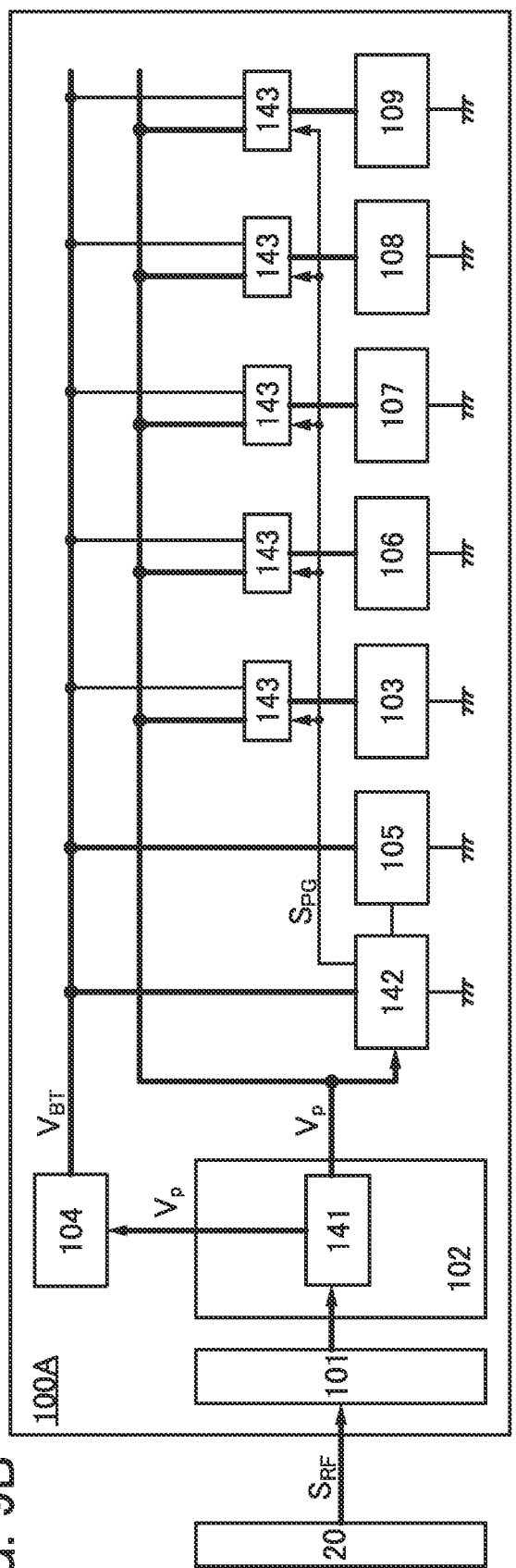

FIG. 9B illustrates a state in which power supply by a wireless signal from the power supply device 20 to the semiconductor device 100A is performed. In this state, a wireless signal $S_{RF}$ is supplied from the power supply device 20 to the antenna 101, and a voltage Vp is generated in the constant voltage circuit 141 on the basis of the wireless signal. The voltage Vp generated in the constant voltage circuit 141 is supplied to the circuits in the semiconductor device 100A. The voltage Vp is also used for charging the battery 104.

The power supply control circuit 142 outputs the signal $S_{PG}$ for controlling the switches 143 in response to the supply of the voltage Vp from the constant voltage circuit 141. The signal $S_{PG}$ output by the power supply control circuit 142 controls the switches 143 so that the voltage Vp is supplied not only to the control circuit 103, the sample-and-hold circuit 108, and the sensor 109 but also to the circuits such as the antenna 101, the transmitting/receiving circuit 102, the memory circuit 106, and the A/D converter circuit 107 (each of which is shown by a solid line) in FIG. 9B.

The semiconductor device of one embodiment of the present invention described above can have a structure in which A/D conversion and signal processing are not performed when power is not supplied; thus, the power consumption of the semiconductor device that operates only with the power of the battery can be reduced. In addition, since the potential of a sampled signal is retained using an OS transistor with a low off-state current, the signal can be retained for a long time. Furthermore, since A/D conversion and signal output are performed only in a period during which stable power supply through the battery is expected, stable operation can be performed. Therefore, it is possible to provide a semiconductor device with a novel structure that is a semiconductor device functioning as a sensor-equipped signal processing device provided with a battery, in which long time driving can be achieved even under an environment with a low charging frequency of the battery.

Embodiment 2

The structure of a semiconductor device of one embodiment of the present invention that is different from the structure described in Embodiment 1, the operation thereof, and modification examples thereof will be described with reference to FIG. 10 to FIG. 14.

Figure 10:
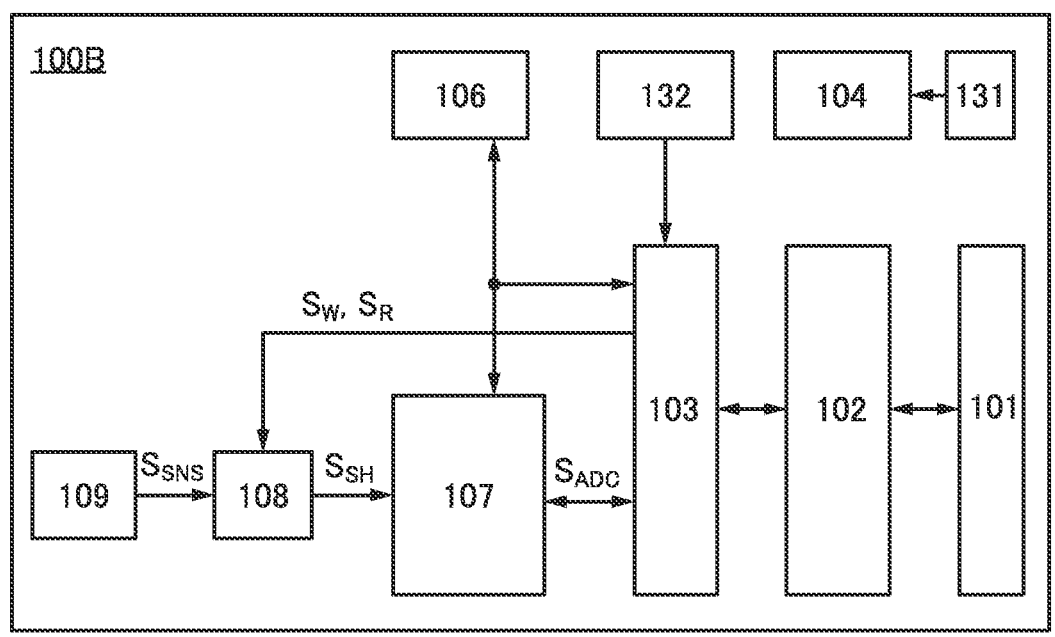
FIG. 10 is a block diagram illustrating the structure of a semiconductor device.

FIG. 10 illustrates a semiconductor device 100B for describing one embodiment of the present invention. As an example, the semiconductor device 100B includes the antenna 101, the transmitting/receiving circuit 102, the control circuit 103, the battery 104, a solar cell 131, a photodetector circuit 132, the memory circuit 106, the A/D converter circuit 107, the sample-and-hold circuit 108, and the sensor 109. The semiconductor device 100B is different from the semiconductor device 100A illustrated in FIG. 1A in that the photodetector circuit 132 is provided instead of the timer circuit 105, and the solar cell 131 is added. Therefore, the others can be performed in a manner similar to that in Embodiment 1, and description of the same components as Embodiment 1 or components having functions similar to those in Embodiment 1 will be omitted.

The photodetector circuit 132 is a circuit for estimating the amount of power generation in the solar cell 131. The control circuit 103 can output the signals $S_W$ and $S_R$ for controlling the sample-and-hold circuit 108 in accordance with the illuminance around the semiconductor device 100B that is estimated in the photodetector circuit 132. It is preferable to provide a power supply control circuit that performs power gating or intermittent operation of the memory circuit 106, the A/D converter circuit 107, the sample-and-hold circuit 108, and the sensor 109, in accordance with the illuminance around the semiconductor device 100B that is estimated in the photodetector circuit 132. The structure makes it possible to set a period during which supply of a power supply voltage is interrupted, so that power consumption can be reduced.

The solar cell 131 is a photoelectric conversion device, which has a function of being capable of generating power in accordance with illuminance. When the solar cell 131 is provided, even without power supply by a wireless signal, it is possible to operate the semiconductor device which is independently installed outdoors, for example.

In the structure of the semiconductor device 100B described in this embodiment, in a period during which power supply from the outside by power generation of the solar cell is not obtained because of sunset or the like, power accumulated in the battery is assigned to driving of the sensor and the sample-and-hold circuit, and the operation of the circuits with large power consumption, such as the A/D converter circuit, is stopped. The sensor and the sample-and-hold circuit obtain signals periodically and retain them. The signals are retained as analog voltages by the sample-and-hold circuit provided with an OS transistor. Since the OS transistor has an extremely low off-state current and a small variation in the characteristics due to temperature, the analog signal obtained by periodic sensing can be retained for a long time. In a period during which power is supplied from the outside by power generation of the solar cell, the analog voltages retained in the sample-and-hold circuit are subjected to AD conversion successively with the power supplied from the outside and retained in the memory circuit or output to a higher-level device.

When the illuminance is low and the amount of power generation by the solar cell is small, the A/D converter circuit is stopped and sampling operation of the analog voltage by the sensor continues. When the illuminance is high and the amount of power generation by the solar cell is sufficiently large, the A/D converter circuit is operated to perform A/D conversion of the retained analog voltages, whereby obtaining the sensing data in every fixed period and reducing the power consumption can both be achieved.

Figure 11A:
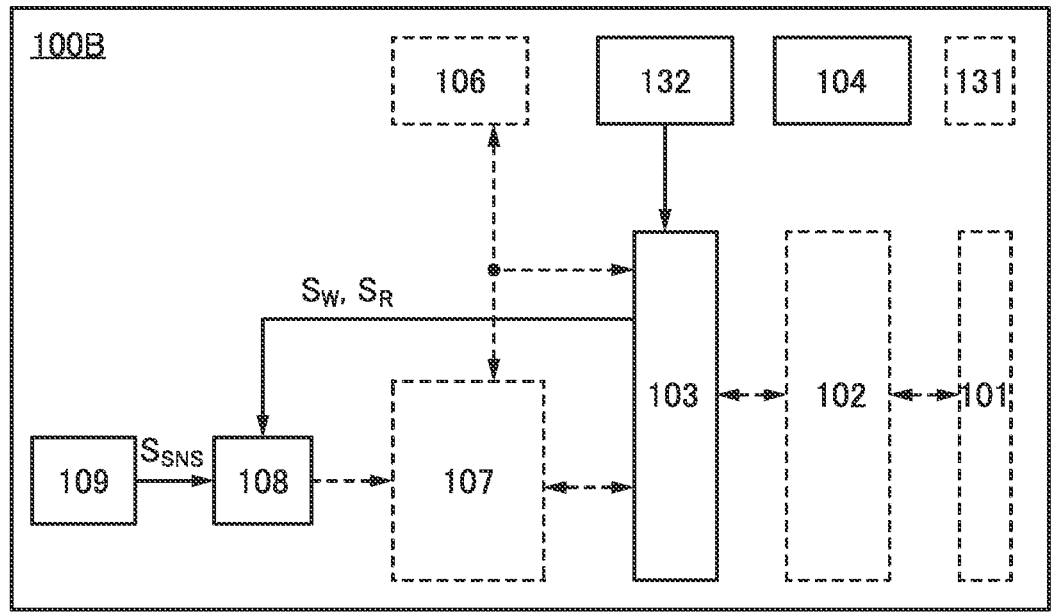
FIG. 11A and FIG. 11B are block diagrams illustrating the structure of a semiconductor device.
Figure 11B:
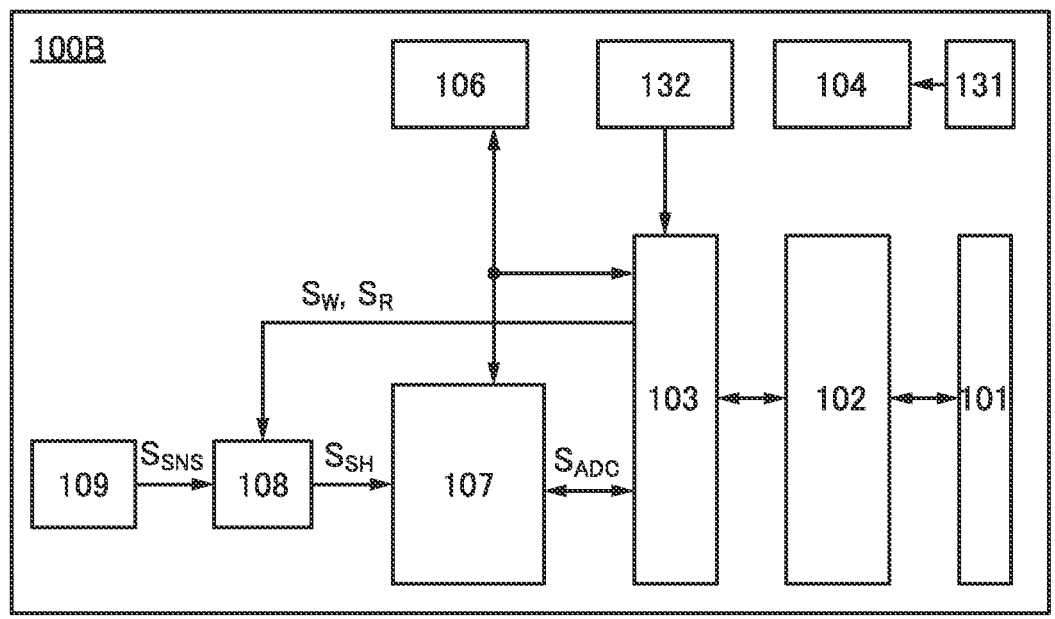

The operation with the above-described structure can be illustrated using block diagrams in FIG. 11A and FIG. 11B. FIG. 11A is a block diagram in which structures that are in a stop state or do not function are shown by dotted lines, and structures that function in an operation state are shown by solid lines.

Operation of the semiconductor device 100B in FIG. 11A corresponds to operation in a period during which each circuit is driven with power accumulated in the battery 104. The structure enables a reduction in the power consumption and extension of the driving time by the battery. When the solar cell 131 does not generate power in the nighttime, for example (illustrated by a dotted line in the diagram), the semiconductor device 100B operates with the power accumulated in the battery 104. The power of the battery 104 is supplied to the control circuit 103, the battery 104, the photodetector circuit 132, the sample-and-hold circuit 108, and the sensor 109 (each of which is shown by a solid line). Meanwhile, when the solar cell 131 does not generate power in the nighttime, for example, the power of the battery 104 is not supplied to the circuits such as the antenna 101, the transmitting/receiving circuit 102, the memory circuit 106, and the A/D converter circuit 107 (each of which is shown by a dotted line).

Operation of the semiconductor device 100B in FIG. 11B is in a period during which each circuit is driven with power supplied by power generation of the solar cell 131 in daytime, for example. The structure enables successive A/D conversion of the voltages D1 to DN retained in the signal retention circuits 112, writing of the signal $S_{ADC}$ obtained by A/D conversion to the memory circuit 106, or ensuring of power sufficient for sending through the antenna 101.

Note that as for periodic sampling of the signal $S_{SNS}$ in the period during which the solar cell 131 does not generate power in the nighttime, for example, a control signal controls each circuit by using an output signal of the photodetector circuit 132 or the like. As an example, power gating of each circuit is described with reference to FIG. 12A and FIG. 12B.

FIG. 12A illustrates the antenna 101, the transmitting/receiving circuit 102, the control circuit 103, the battery 104, the solar cell 131, the photodetector circuit 132, the memory circuit 106, the A/D converter circuit 107, the sample-and-hold circuit 108, and the sensor 109, which are illustrated in FIG. 10; the power supply control circuit 142; and the switches 143.

FIG. 12A shows a state without power supply by the solar cell 131. In this state, the voltage VBT output by the battery 104 is supplied to the circuits in the semiconductor device 100B as described above. Bold solid lines in FIG. 12A show the state of supply of the voltage to the circuits. A voltage generated based on sunlight is supplied to the circuits in the semiconductor device 100B. Since there is no power supply by the solar cell 131 in the state of FIG. 12A, dotted lines show a state without supply of voltage to the circuits.

The power supply control circuit 142 outputs the signal $S_{PG}$ for controlling the switches 143 in accordance with a signal corresponding to the illuminance obtained in the photodetector circuit 132. In the case of FIG. 12A, the illuminance obtained in the photodetector circuit 132 is low, and power is not supplied by the solar cell 131. The signal $S_{PG}$ output by the power supply control circuit 142 controls the switches 143 so that the power of the battery 104 is supplied to the control circuit 103, the sample-and-hold circuit 108, and the sensor 109 (each of which is shown by a solid line) and is not supplied to the circuits such as the antenna 101, the transmitting/receiving circuit 102, the memory circuit 106, and the A/D converter circuit 107 (each of which is shown by a dotted line) in FIG. 12A.

FIG. 12B illustrates a state with power supply by the solar cell 131. In this state, the voltage Vp is supplied from the solar cell 131 to the battery 104 and the battery 104 is charged. The voltage $V_{BT}$ output from the battery 104 is supplied to the circuits in the semiconductor device 100B.

The power supply control circuit 142 outputs the signal $S_{PG}$ for controlling the switches 143 in accordance with a signal corresponding to the illuminance obtained in the photodetector circuit 132. In the case of FIG. 12B, the illuminance obtained in the photodetector circuit 132 is high, and power is supplied by the solar cell 131. The signal $S_{PG}$ output by the power supply control circuit 142 controls the switches 143 so that the voltage Vp is supplied not only to the control circuit 103, the sample-and-hold circuit 108, and the sensor 109 but also to the circuits including the antenna 101, the transmitting/receiving circuit 102, the memory circuit 106, and the A/D converter circuit 107 (each of which is shown by a solid line) in FIG. 12B.

Figure 13A:
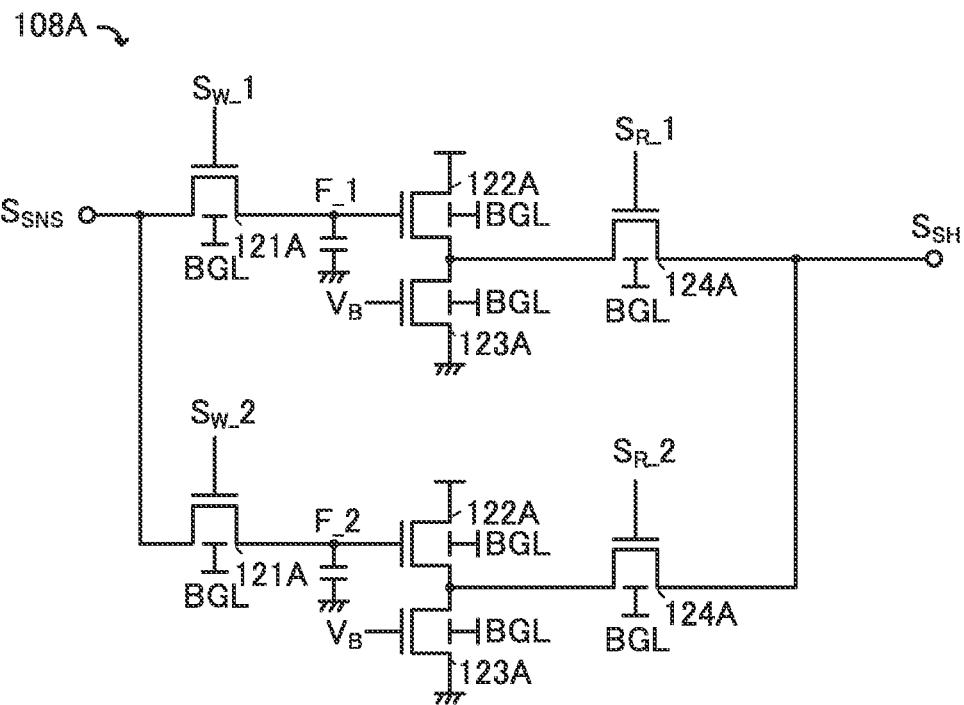
FIG. 13A and FIG. 13B are circuit diagrams each illustrating operation of a semiconductor device.
Figure 13B:
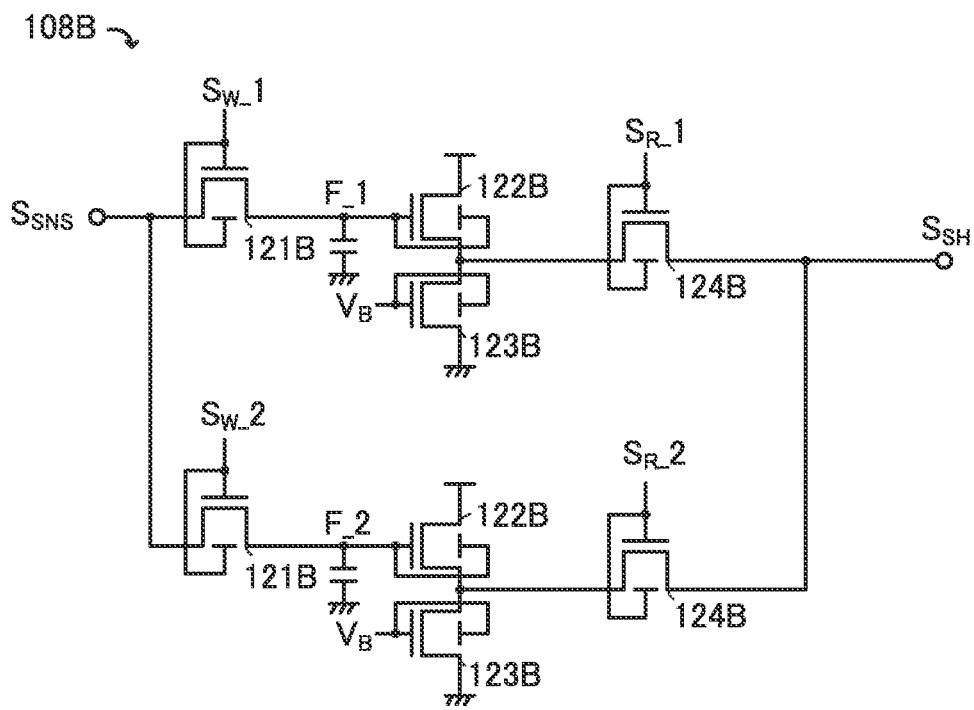

FIG. 13A and FIG. 13B illustrate modification examples of a circuit structure applicable to the transistors included in the sample-and-hold circuit 108 described above.

The transistors 121 to 124 in FIG. 1C and the like each have a top-gate structure or a bottom-gate transistor without a back gate; however, the structures of the transistors 121 to 124 are not limited thereto. For example, as in a sample-and-hold circuit 108A illustrated in FIG. 13A, transistors 121A to 124A each including a back gate electrode may be used. With the structure in FIG. 13A, the state of the transistors 121A to 124A can be easily controlled from the outside.

For example, as in a sample-and-hold circuit 108B illustrated in FIG. 13B, transistors 121B to 124B each including a back gate electrode connected to a gate electrode may also be used. With the structure in FIG. 13B, the amount of current flowing through the transistors 121B to 124B can be increased.

Figure 14:
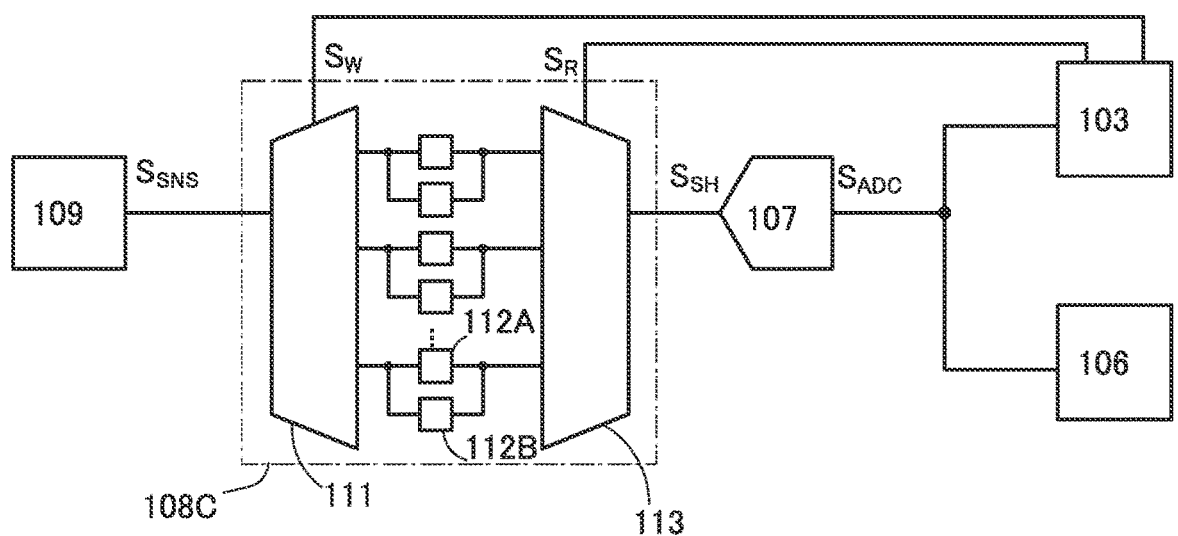
FIG. 14 is a block diagram illustrating operation of a semiconductor device.

FIG. 14 illustrates a modification example of the sample-and-hold circuit 108 in FIG. 1B.

A sample-and-hold circuit 108C illustrated in FIG. 14 includes signal retention circuits 112A and 112B for retaining analog voltages obtained by sampling of the signals SSNS. Correlated analog voltages are retained in the signal retention circuits 112A and 112B, and a difference between the voltages retained in the signal retention circuits 112A and 112B is calculated by the control circuit 103. With the structure, noise can be removed by a CDS (Correlated Double Sampling) method.

The semiconductor device of one embodiment of the present invention described above can have a structure in which A/D conversion and signal processing are not performed when power is not supplied; thus, the power consumption of the semiconductor device that operates only with the power of the battery can be reduced. In addition, since the potential of a sampled signal is retained using an OS transistor with a low off-state current, the signal can be retained for a long time. Furthermore, since A/D conversion and signal output are performed only in a period during which stable power supply through the battery is expected, stable operation can be performed. Therefore, it is possible to provide a semiconductor device with a novel structure that is a semiconductor device functioning as a sensor-equipped signal processing device provided with a battery, in which long time driving can be achieved even under an environment with a low charging frequency of the battery.

Embodiment 3

In this embodiment, a structure of a transistor applicable to the semiconductor device described in the above embodiment, specifically, a structure in which transistors having different electrical characteristics are stacked will be described. In particular, in this embodiment, a structure of each transistor included in a delay circuit in the semiconductor device will be described. With the structure, the degree of flexibility in design of the semiconductor device can be increased. Furthermore, when transistors having different electrical characteristics are stacked, the integration degree of the semiconductor device can be increased.

Figure 15:
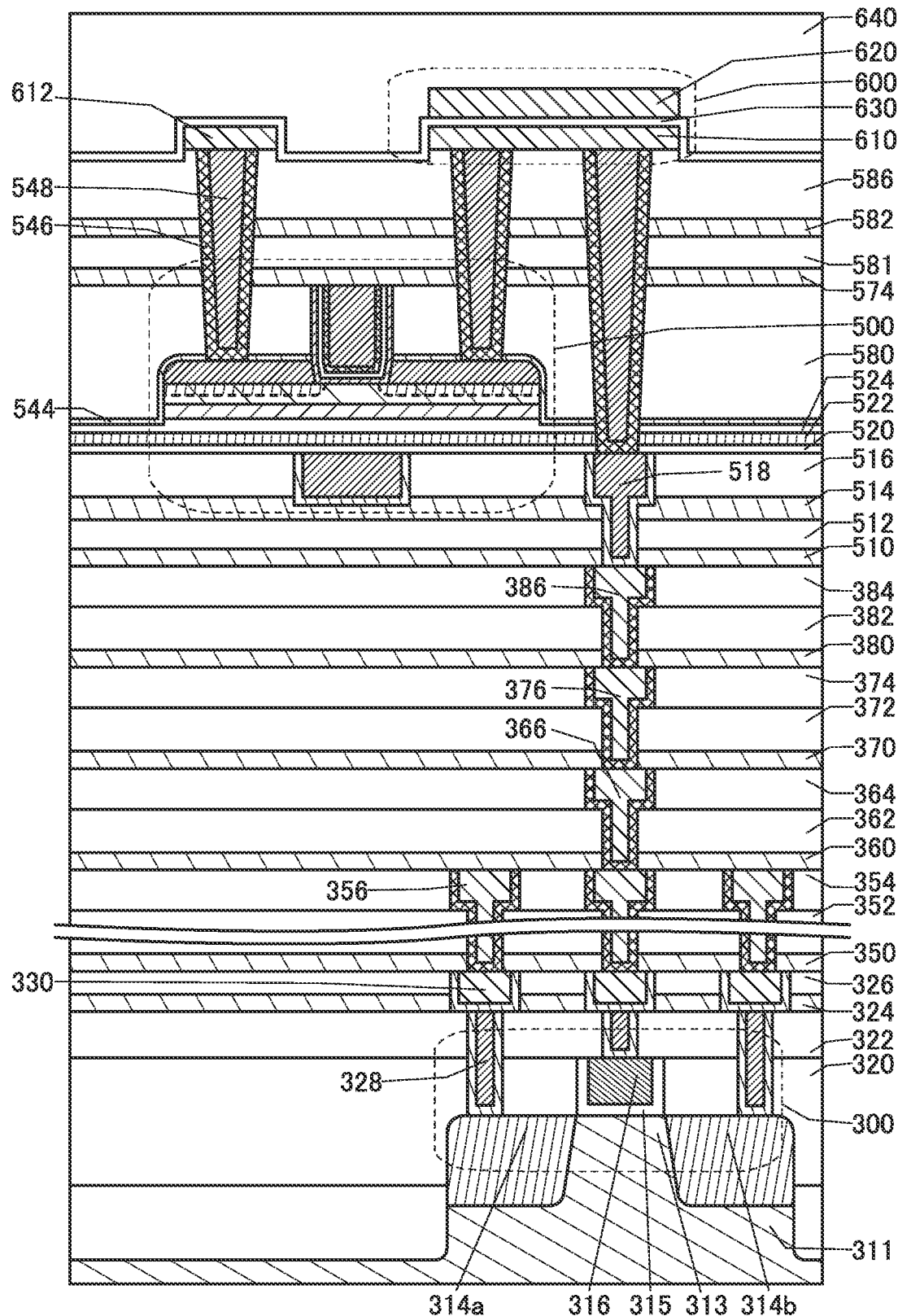
FIG. 15 is a schematic cross-sectional view illustrating the structure of a semiconductor device.
Figure 17A:
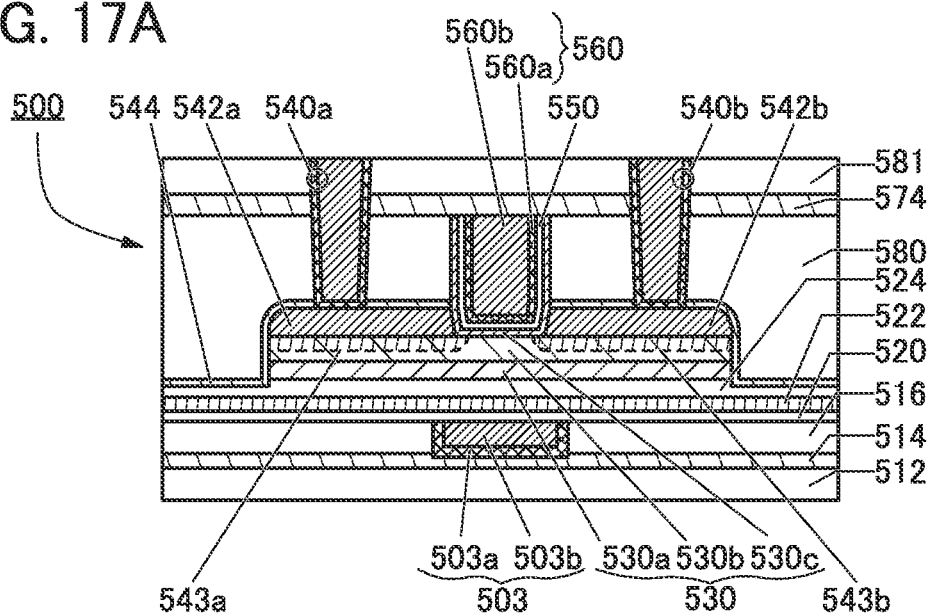
FIG. 17A, FIG. 17B, and FIG. 17C are schematic cross-sectional views illustrating the structure of a semiconductor device.
Figure 17B:
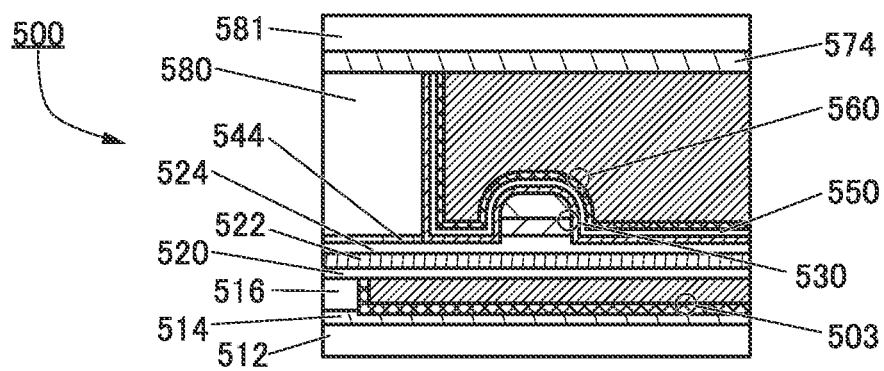
Figure 17C:
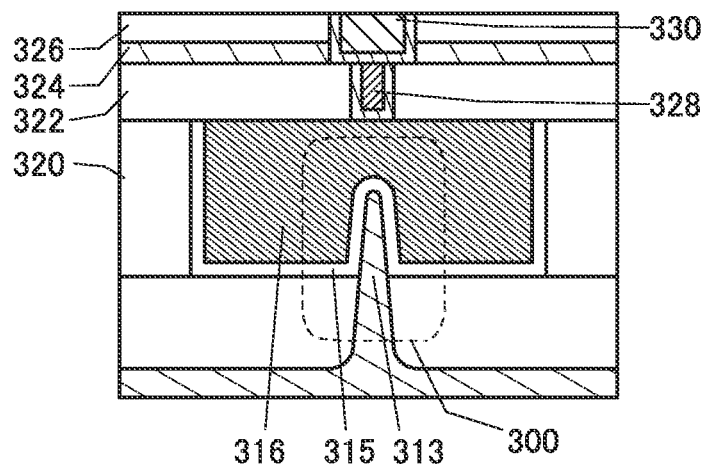

A semiconductor device illustrated in FIG. 15 includes a transistor 300, a transistor 500, and a capacitor 600. FIG. 17A is a cross-sectional view of the transistor 500 in the channel length direction, FIG. 17B is a cross-sectional view of the transistor 500 in the channel width direction, and FIG. 17C is a cross-sectional view of the transistor 300 in the channel width direction.

The transistor 500 is a transistor including a metal oxide in a channel formation region (an OS transistor). Since the off-state current of the transistor 500 is low, when the transistor 500 is used as an OS transistor included in the semiconductor device, written data voltage or charge can be retained for a long time. In other words, the frequency of refresh operation is low or refresh operation is not required; thus, power consumption of the semiconductor device can be reduced.

The semiconductor device described in this embodiment includes the transistor 300, the transistor 500, and the capacitor 600, as illustrated in FIG. 15. The transistor 500 is provided above the transistor 300, and the capacitor 600 is provided above the transistor 300 and the transistor 500. Note that the capacitor 600 can be a capacitor Cs in a memory circuit MC, for example.

The transistor 300 is provided on a substrate 311 and includes a conductor 316, an insulator 315, a semiconductor region 313 that is a part of the substrate 311, and a low-resistance region 314*a* and a low-resistance region 314*b* functioning as a source region and a drain region. For example, the transistor 300 can be used as the transistor or the like included in the A/D converter circuit 107 in the above embodiment.

In the transistor 300, the top surface and the side surface in the channel width direction of the semiconductor region 313 are covered with the conductor 316 with the insulator 315 therebetween, as illustrated in FIG. 17C. Such a FIN-type transistor 300 can have an increased effective channel width, and thus have improved on-state characteristics. In addition, contribution of electric fields of the gate electrode can be increased, so that the off-state characteristics of the transistor 300 can be improved.

Note that the transistor 300 can be a p-channel transistor or an n-channel transistor.

A region of the semiconductor region 313 where a channel is formed, a region in the vicinity thereof, the low-resistance region 314*a* and the low-resistance region 314*b* functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. Silicon whose effective mass is adjusted by applying stress to the crystal lattice and thereby changing the lattice spacing may be used. Alternatively, the transistor 300 may be an HEMT (High Electron Mobility Transistor) with GaAs and GaAlAs, or the like.

The low-resistance region 314*a* and the low-resistance region 314*b* contain an element that imparts n-type conductivity, such as arsenic or phosphorus, or an element that imparts p-type conductivity, such as boron, in addition to a semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or a conductive material such as a metal material, an alloy material, or a metal oxide material.

Note that the work function depends on a material used for a conductor; therefore, selecting the material for the conductor can adjust the threshold voltage of the transistor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 16:
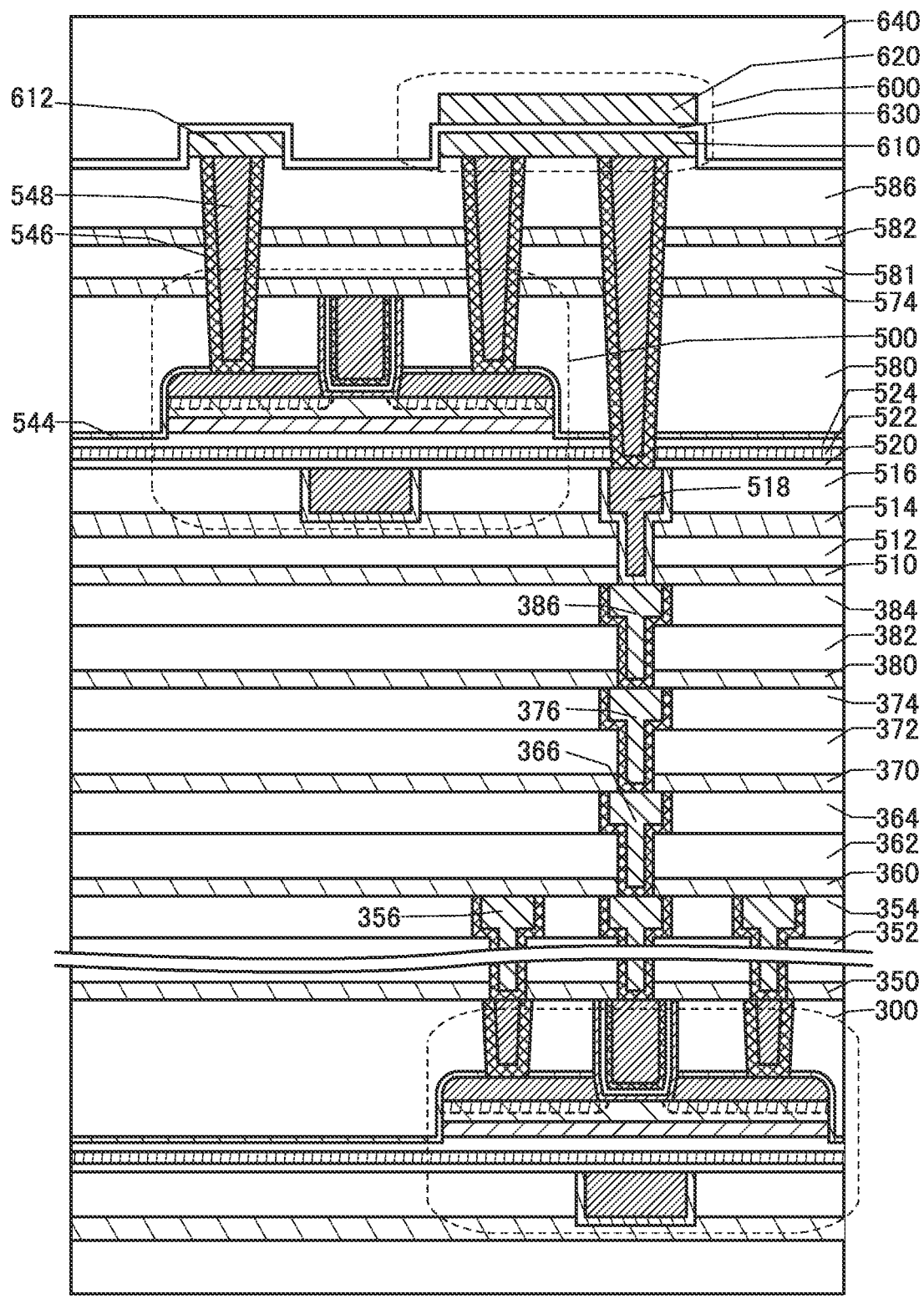
FIG. 16 is a schematic cross-sectional view illustrating the structure of a semiconductor device.

Note that the transistor 300 illustrated in FIG. 15 is an example and the structure is not limited thereto; an appropriate transistor can be used in accordance with a circuit structure or a driving method. For example, when the semiconductor device is a single-polarity circuit using only OS transistors (which represent transistors having the same polarity, e.g., only n-channel transistors), the transistor 300 has a structure similar to that of the transistor 500 using an oxide semiconductor, as illustrated in FIG. 16. Note that the details of the transistor 500 are described later.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for eliminating a level difference caused by the transistor 300 or the like provided under the insulator 322. For example, the top surface of the insulator 322 may be planarized by planarization treatment using a chemical mechanical polishing (CMP) method or the like to improve planarity.

In addition, for the insulator 324, it is preferable to use a film having a barrier property that prevents diffusion of hydrogen or impurities from the substrate 311, the transistor 300, or the like to a region where the transistor 500 is provided.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material having a low permittivity is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Furthermore, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 15, an insulator 350, an insulator 352, and an insulator 354 are stacked in this order. A conductor 356 is formed in the insulator 350, the insulator 352, and the insulator 354. The conductor 356 has a function of a plug or a wiring that is connected to the transistor 300. Note that the conductor 356 can be formed using a material similar to those for the conductor 328 and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening of the insulator 350 having a barrier property against hydrogen. With the structure, the transistor 300 and the transistor 500 can be separated by the barrier layer, so that the diffusion of hydrogen from the transistor 300 to the transistor 500 can be inhibited.

Note that for the conductor having a barrier property against hydrogen, tantalum nitride is preferably used, for example. Stacking tantalum nitride and tungsten having high conductivity can inhibit the diffusion of hydrogen from the transistor 300 while the conductivity of a wiring is ensured. In that case, the tantalum nitride layer having a barrier property against hydrogen is preferably in contact with the insulator 350 having a barrier property against hydrogen.

A wiring layer may be provided over the insulator 354 and the conductor 356. For example, in FIG. 15, an insulator 360, an insulator 362, and an insulator 364 are stacked in this order. Moreover, a conductor 366 is formed in the insulator 360, the insulator 362, and the insulator 364. The conductor 366 has a function of a plug or a wiring. Note that the conductor 366 can be formed using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening of the insulator 360 having a barrier property against hydrogen. With the structure, the transistor 300 and the transistor 500 can be separated by the barrier layer, so that the diffusion of hydrogen from the transistor 300 to the transistor 500 can be inhibited.

A wiring layer may be provided over the insulator 364 and the conductor 366. For example, in FIG. 15, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be formed using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening of the insulator 370 having a barrier property against hydrogen. With the structure, the transistor 300 and the transistor 500 can be separated by the barrier layer, so that the diffusion of hydrogen from the transistor 300 to the transistor 500 can be inhibited.

A wiring layer may be provided over the insulator 374 and the conductor 376. For example, in FIG. 15, an insulator 380, an insulator 382, and an insulator 384 are stacked in this order. Moreover, a conductor 386 is formed in the insulator 380, the insulator 382, and the insulator 384. The conductor 386 has a function of a plug or a wiring. Note that the conductor 386 can be formed using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening of the insulator 380 having a barrier property against hydrogen. With the structure, the transistor 300 and the transistor 500 can be separated by the barrier layer, so that the diffusion of hydrogen from the transistor 300 to the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked in this order over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 300 is provided, or the like to the region where the transistor 500 is provided. Therefore, a material similar to that for the insulator 324 can be used.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With the structure, the transistor 300 and the transistor 500 can be separated by the layer having a barrier property against oxygen, hydrogen, and water; thus, diffusion of hydrogen from the transistor 300 to the transistor 500 can be inhibited.

The transistor 500 is provided above the insulator 516.

As illustrated in FIG. 17A and FIG. 17B, the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and is provided with an opening formed to overlap with a region between the conductor 542a and the conductor 542b, an oxide 530c positioned on a bottom and a side surface of the opening, an insulator 550 positioned on a formation surface of the oxide 530c, and a conductor 560 positioned on a formation surface of the insulator 550.

As illustrated in FIG. 17A and FIG. 17B, an insulator 544 is preferably provided between the insulator 580 and the oxide 530a, the oxide 530b, the conductor 542a, and the conductor 542b. In addition, as illustrated in FIG. 17A and FIG. 17B, the conductor 560 preferably includes a conductor 560a provided inside the insulator 550 and a conductor 560b embedded inside the conductor 560a. As illustrated in FIG. 17A and FIG. 17B, an insulator 574 is preferably provided over the insulator 580, the conductor 560, and the insulator 550.

Note that in the following description, the oxide 530a, the oxide 530b, and the oxide 530c are sometimes collectively referred to as an oxide 530.

Note that although a structure of the transistor 500 in which three layers of the oxide 530a, the oxide 530b, and the oxide 530c are stacked in a region where a channel is formed and its vicinity is shown, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Although the conductor 560 is shown to have a stacked-layer structure of two layers in the transistor 500, the present invention is not limited thereto. For example, the conductor 560 may have a single-layer structure or a stacked-layer structure of three or more layers. The transistor 500 illustrated in FIG. 15, FIG. 17A, and FIG. 17B is an example, and the structure is not limited thereto; an appropriate transistor can be used in accordance with a circuit structure or a driving method.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the transistor 500 can have improved switching speed and excellent frequency characteristics.

The conductor 560 functions as a first gate (also referred to as top gate) electrode in some cases. The conductor 503 functions as a second gate (also referred to as bottom gate) electrode in some cases. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected and can cover the channel formation region formed in the oxide 530. In this specification and the like, a transistor structure in which a channel formation region is electrically surrounded by electric fields of a first gate electrode and a second gate electrode is referred to as a surrounded channel (S-channel) structure.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. In that case, the conductor 503a is not necessarily provided. Note that the conductor 503b is shown as a single layer but may have a stacked-layer structure, for example, a stack of the above conductive material and titanium or titanium nitride.

The insulator 520, the insulator 522, the insulator 524, and the insulator 550 have a function of a second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in a range of higher than or equal to 100° C. and lower than or equal to 700° C., or higher than or equal to 100° C. and lower than or equal to 400° C.

In the case where the insulator 524 includes an excess-oxygen region, it is preferable that the insulator 522 have a function of inhibiting diffusion of oxygen (e.g., an oxygen atom, an oxygen molecule, or the like) (the oxygen is less likely to pass).

The insulator 522 preferably has a function of inhibiting diffusion of oxygen or impurities, in which case diffusion of oxygen contained in the oxide 530 to the insulator 520 side is prevented. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during operation of the transistor can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 to the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

It is preferable that the insulator 520 be thermally stable. For example, silicon oxide and silicon oxynitride, which have thermal stability, are suitable. Furthermore, when an insulator which is a high-k material is combined with silicon oxide or silicon oxynitride, the insulator 520 having a stacked-layer structure that has thermal stability and a high relative permittivity can be obtained.

Note that in the transistor 500 in FIG. 17A and FIG. 17B, the insulator 520, the insulator 522, and the insulator 524 are shown as the second gate insulating film having a stacked-layer structure of three layers; however, the second gate insulating film may be a single layer or may have a stacked-layer structure of two layers or four or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one kind or a plurality of kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. The In-M-Zn oxide that can be used as the oxide 530 is particularly preferably a CAAC-OS or a CAC-OS each of which will be described in Embodiment 4. Furthermore, as the oxide 530, an In—Ga oxide or an In—Zn oxide may be used.

Furthermore, a metal oxide with a low carrier concentration is preferably used for the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. As examples of the impurities in the metal oxide, hydrogen, nitrogen, alkali metal, alkaline earth metal, iron, nickel, silicon, and the like are given.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics in some cases. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using a metal oxide containing much hydrogen is likely to have normally-on characteristics.

A defect in which hydrogen has entered an oxygen vacancy can function as a donor of the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Therefore, when a metal oxide is used as the oxide 530, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide with a sufficiently low concentration of impurities such as hydrogen is used for a channel formation region of a transistor, the transistor can have stable electrical characteristics.

In the case where a metal oxide is used as the oxide 530, the carrier concentration of the metal oxide semiconductor in a region functioning as the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, and yet still further preferably lower than $1 \times 10^{12}$ cm$^{-3}$. Note that the lower limit of the carrier concentration of the metal oxide in the region functioning as the channel formation region is not particularly limited and can be, for example, $1\times10^{-9}$ cm$^{-3}$.

When a metal oxide is used as the oxide 530, contact between a conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 to the conductor 542 can be interpreted as absorption of oxygen in the oxide 530 by the conductor 542.

When oxygen in the oxide 530 diffuses to the conductor 542 (the conductor 542a and the conductor 542b), another layer is sometimes formed between the conductor 542a and the oxide 530b, and between the conductor 542b and the oxide 530b. The layer contains more oxygen than the conductor 542 does and thus the layer presumably has an insulating property. In this case, a three-layer structure of the conductor 542, the layer, and the oxide 530b can be regarded as a three-layer structure of a metal, an insulator, and a semiconductor and is sometimes referred to as a MIS (Metal-Insulator-Semiconductor) structure or a diode junction structure that mainly has a MIS structure.

The above layer is not necessarily formed between the conductor 542 and the oxide 530b, but the layer may be formed between the conductor 542 and the oxide 530c or formed between the conductor 542 and the oxide 530b and between the conductor 542 and the oxide 530c.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

By including the oxide 530a under the oxide 530b, the oxide 530 can inhibit diffusion of impurities to the oxide 530b from the components formed below the oxide 530a. By including the oxide 530c over the oxide 530b, the oxide 530 can inhibit diffusion of impurities into the oxide 530b from the components formed above the oxide 530c.

Note that the oxide 530 preferably has a stacked-layer structure of oxides that differ in the atomic ratio of metal atoms. Specifically, the atomic ratio of the element M to the constituent elements in the metal oxide used as the oxide 530a is preferably greater than the atomic ratio of the element M to the constituent elements in the metal oxide used as the oxide 530b. Moreover, the atomic ratio of the element M to In in the metal oxide used as the oxide 530a is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530a. Moreover, a metal oxide that can be used as the oxide 530a or the oxide 530b can be used as the oxide 530c.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To change the energy level gradually, the densities of defect states in mixed layers formed at an interface between the oxide 530a and the oxide 530b and an interface between the oxide 530b and the oxide 530c is preferably made low.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal element; or the like. For example, it is preferable to use tantalum nitride, titanium nitride, tungsten nitride, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 17A, a stacked-layer structure of two or more layers may be employed. For example, a tantalum nitride film and a tungsten film may be stacked.

Alternatively, a titanium film and an aluminum film may be stacked. Further alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as illustrated in FIG. 17A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. The channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier concentration of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover the side surface of the oxide 530 and to be in contact with the insulator 524.

A metal oxide containing one or more selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 to the oxide 530b through the oxide 530c and the insulator 550 can be inhibited. Furthermore, oxidation of the conductor 560 due to excess oxygen contained in the insulator 580 can be inhibited.

The insulator 550 functions as a first gate insulating film. The insulator 550 is preferably positioned in contact with an inner side (the top surface and the side surface) of the oxide 530c. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator from which oxygen is released by heating is provided as the insulator 550 in contact with the top surface of the oxide 530c, oxygen can be efficiently supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidization of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as leakage current might arise because of a thinner gate insulating film. For that reason, when the insulating film functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high relative permittivity.

Although the conductor 560 functioning as the first gate electrode has a two-layer structure in FIG. 17A and FIG. 17B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting oxygen diffusion, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited by a sputtering method, the conductor 560a can have a reduced electrical resistance value to be a conductor. This can be called an OC (Oxide Conductor) electrode.

In addition, a conductive material containing tungsten, copper, or aluminum as its main component is preferably used for the conductor 560b. The conductor 560b also functions as a wiring and thus is preferably formed using a conductor having high conductivity. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542*a* and the conductor 542*b* with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide, in which an excess-oxygen region can be easily formed in a later step, are preferable.

The insulator 580 preferably includes an excess-oxygen region. When the insulator 580 from which oxygen is released by heating is provided in contact with the oxide 530*c*, oxygen in the insulator 580 can be efficiently supplied to the oxide 530 through the oxide 530*c*. Note that the concentration of impurities such as water or hydrogen in the insulator 580 is preferably reduced.

The opening of the insulator 580 is formed to overlap with a region between the conductor 542*a* and the conductor 542*b*. Accordingly, the conductor 560 is formed to be embedded in the opening of the insulator 580 and the region between the conductor 542*a* and the conductor 542*b*.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; hence, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one or more selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 or the like, the concentration of impurities such as water or hydrogen in the insulator 581 is preferably reduced.

Furthermore, a conductor 540*a* and a conductor 540*b* are positioned in openings formed in the insulator 581, the insulator 574, the insulator 580, and the insulator 544. The conductor 540*a* and the conductor 540*b* are provided to face each other with the conductor 560 therebetween. The structures of the conductor 540*a* and the conductor 540*b* are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. For example, a silicon oxide film, a silicon oxynitride film, or the like can be used for the insulator 586.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using materials similar to those for the conductor 328 and the conductor 330.

In addition, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are illustrated in FIG. 15, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a semiconductor device using a transistor including an oxide semiconductor can be miniaturized or highly integrated.

Embodiment 4

Figure 18A:
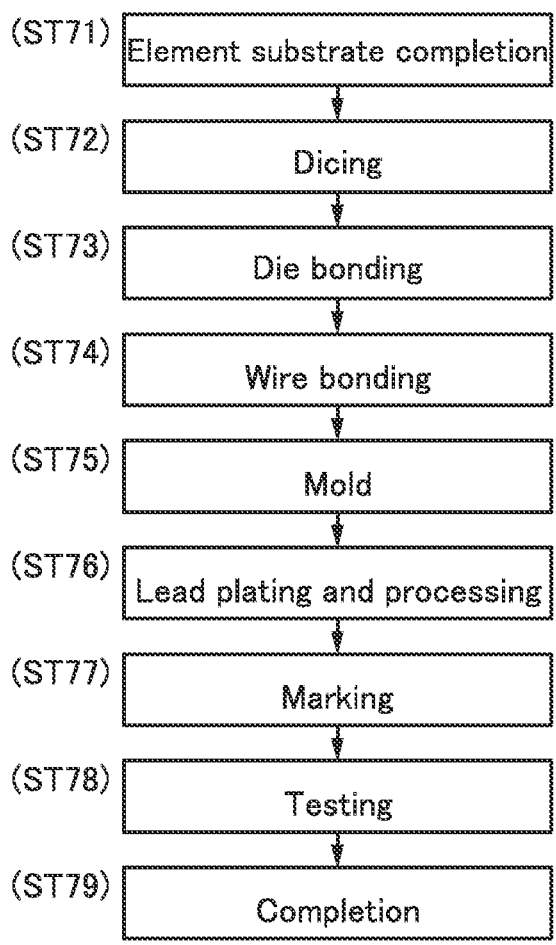
FIG. 18A, FIG. 18B, FIG. 18C, FIG. 18D, and FIG. 18E are diagrams illustrating the structure of an electronic component.

In this embodiment, application examples of a semiconductor device will be described.
<Fabrication Method Example of Electronic Component>
FIG. 18A is a flow chart showing an example of a method for fabricating an electronic component. The electronic component is also referred to as a semiconductor package or an IC package. The electronic component described below corresponds to an electronic component provided with transistors included in the semiconductor device.

A semiconductor device formed with transistors is completed by integrating detachable components on a printed circuit board through an assembly process (post-process). The post-process can be completed through steps shown in FIG. 18A. Specifically, after an element substrate obtained in a pre-process is completed (Step ST71), a back surface of the substrate is ground. The substrate is thinned in this step to reduce warpage or the like of the substrate in the pre-process and to reduce the size of the component. Then, a dicing step of dividing the substrate into a plurality of chips is performed (Step ST72).

Figure 18B:
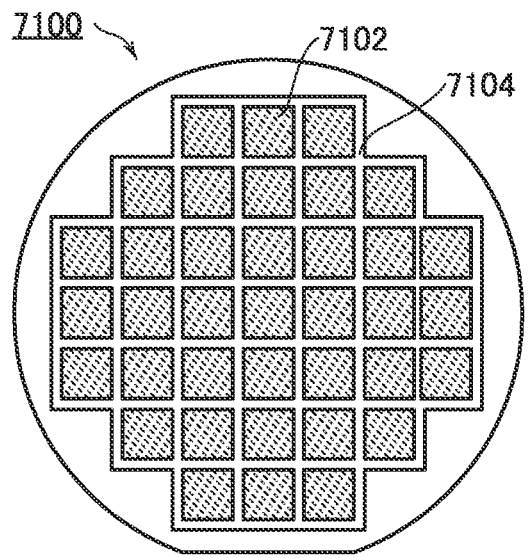
Figure 18C:
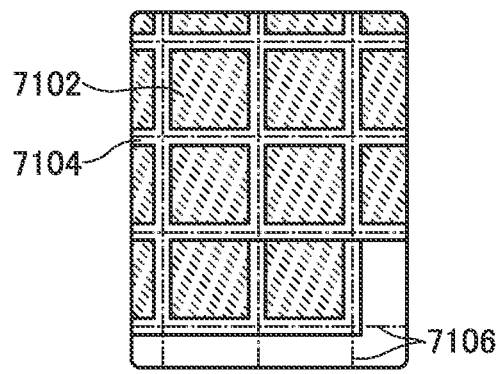

FIG. 18B is a top view of a semiconductor wafer 7100 before a dicing process. FIG. 18C is an enlarged view of part of FIG. 18B. A plurality of circuit regions 7102 are provided on the semiconductor wafer 7100. The semiconductor device of an embodiment of the present invention is provided in the circuit region 7102.

Figure 18D:
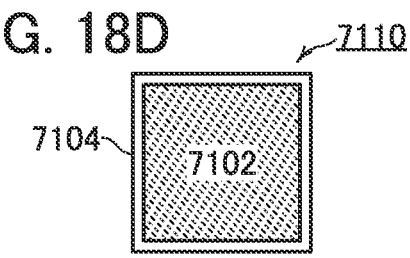

The plurality of circuit regions 7102 are each surrounded by a separation region 7104. Separation lines (also referred to as "dicing lines") 7106 are set at positions overlapping with the separation region 7104. In the dicing step ST72, the semiconductor wafer 7100 is cut along the separation lines 7106, whereby chips 7110 including the circuit regions 7102 are cut out from the semiconductor wafer 7100. FIG. 18D is an enlarged view of the chip 7110.

A conductive layer or a semiconductor layer may be provided in the separation region 7104. Providing a conductive layer or a semiconductor layer in the separation region 7104 relieves ESD (Electro Static Discharge) that might be caused in the dicing step, preventing a decrease in the yield due to the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation region 7104 allows a reduction in the usage of the pure water. Therefore, the manufacturing cost of semiconductor devices can be reduced. Furthermore, productivity of the semiconductor device can be increased.

After Step ST72, the divided chips are separately picked up, placed on a lead frame, and bonded thereto in a die bonding step (Step ST73). As a method for bonding the chip to the lead frame in the die bonding step, a method suitable for the product may be selected. The bonding may be performed, for example, with a resin or a tape. In the die bonding step, the chip may be mounted on an interposer and bonded thereto. In a wire bonding step, a lead of the lead frame and an electrode on the chip are electrically connected to each other with a metal fine line (wire) (Step ST74). A silver line or a gold line can be used as the metal fine line. The wire bonding may be either ball bonding or wedge bonding.

A wire-bonded chip is subjected to a molding step of sealing the chip with an epoxy resin or the like (Step ST75). With the molding step, the inside of the electronic component is filled with a resin, so that damage to the circuit portion and the wire embedded by external mechanical force can be reduced, and degradation in characteristics due to moisture or dust can be reduced. Subsequently, the lead of the lead frame is plated. After that, the lead is cut and processed (Step ST76). This plating process prevents rust of the lead and enables more reliable soldering at the time of mounting the electronic component on a printed circuit board in a later step. Then, printing process (marking) is performed on a surface of the package (Step ST77). After a testing step (Step ST78), the electronic component is completed (Step ST79).

Figure 18E:
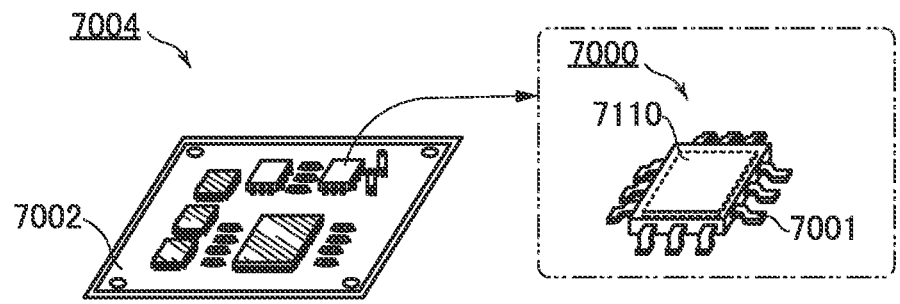

FIG. 18E shows a schematic perspective view of the completed electronic component. FIG. 18E shows a schematic perspective view of a QFP (Quad Flat Package) as an example of the electronic component. As illustrated in FIG. 18E, an electronic component 7000 includes a lead 7001 and a chip 7110.

The electronic component 7000 is mounted on a printed circuit board 7002, for example. A plurality of electronic components 7000 which are combined and electrically connected to each other over the printed circuit board 7002 can be mounted on an electronic device. A completed circuit board 7004 is provided in an electronic device or the like.

Figure 19A:
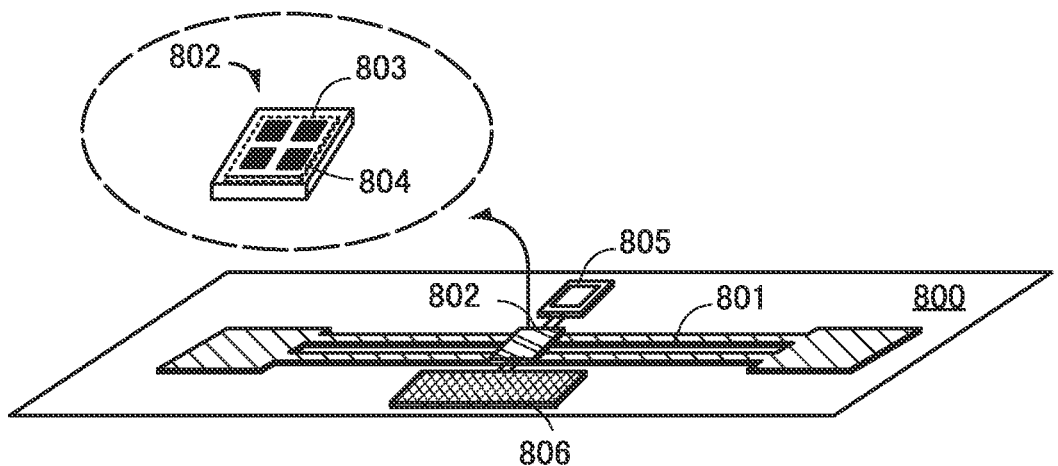
FIG. 19A, FIG. 19B, and FIG. 19C are diagrams illustrating application examples of a semiconductor device.

The electronic component 7000 can be combined with components such as a sensor, an antenna, and the like to form a semiconductor device. Examples of a mode to which a sensor is applicable include application to an electronic component that needs to be monitored periodically, such as an electronic device or a battery, and embedding in a structure or a living body.
<Application Example of Semiconductor Device>
FIG. 19A is a perspective view of the semiconductor device described in the above embodiment. As illustrated in FIG. 19A, a semiconductor device 800 includes an antenna 801, an integrated circuit portion 802, a sensor 805, and a battery 806.

The antenna 801 may have any size and shape appropriate for the purpose, as long as it is within a range defined by the law of each country where the semiconductor device 800 is used.

The integrated circuit portion 802 includes a circuit 803 including a Si transistor and an OS transistor and a terminal portion 804 for connection to the antenna. The circuit 803 is formed through the pre-process for forming the Si transistor and the OS transistor. The terminal portion 804 is formed through the post-process for forming a chip, which includes a dicing step and a bonding step. The integrated circuit portion 802 corresponds to the above electronic component.

The sensor 805 is a circuit that has a function of outputting a variety of information such as thermal or electromagnetic information as analog data.

Figure 19B:
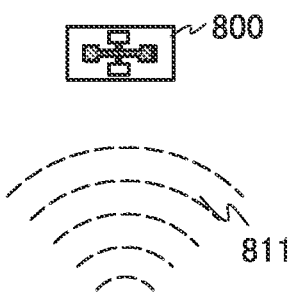

FIG. 19B is a schematic view of the semiconductor device 800 in FIG. 19A, which receives a wireless signal 811. The semiconductor device 800 can have a structure in which A/D conversion and signal processing are not performed when power is not supplied; thus, the power consumption of the semiconductor device that operates only with the power of the battery can be reduced. Since the potential of the sampled signal is retained using an OS transistor with a low off-state current, the signal can be retained for a long time. In addition, since A/D conversion and signal output are performed only in a period during which stable power supply through the battery is expected, stable operation can be performed. Therefore, it is possible to provide a semiconductor device with a novel structure that is a semiconductor device functioning as a sensor-equipped signal processing device provided with a battery, in which long time driving can be achieved even in an environment with a low charging frequency of the battery.

Figure 19C:
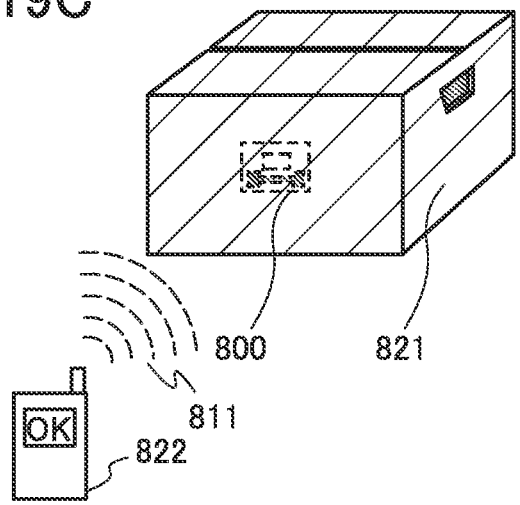

An application mode of such a semiconductor device can be described with reference to a perspective view illustrated in FIG. 19C. For example, the semiconductor device 800 is attached to or incorporated in an article 821, and the wireless signal 811 is sent from an external interrogator 822. The semiconductor device 800, which has received the wireless signal 811, can sequentially obtain information such as temperature as an analog voltage by the sensor with the use of the power of the battery 806 and can perform A/D conversion and sending at the time of receiving the wireless signal 811 from the interrogator 822.

Figure 20A:
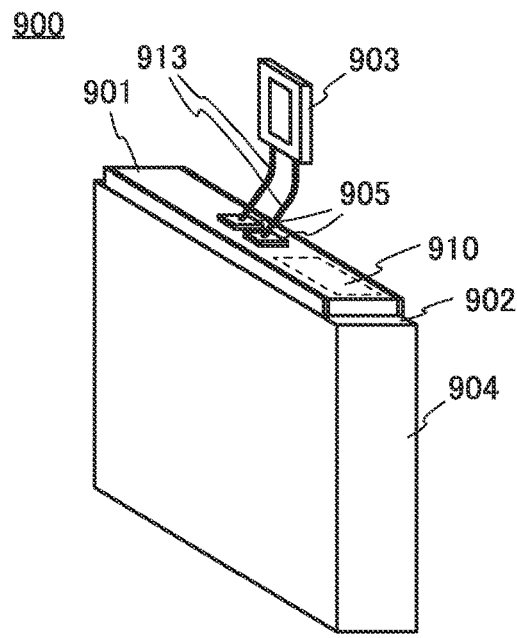
FIG. 20A and FIG. 20B are diagrams illustrating an application example of a semiconductor device.
Figure 20B:
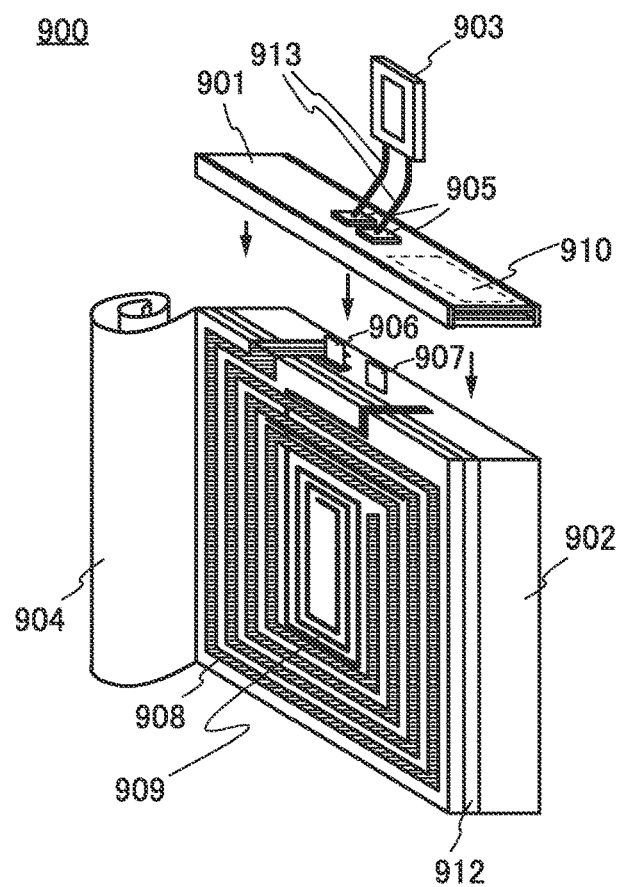

FIG. 20A and FIG. 20B are perspective views for describing another application mode of the semiconductor device 800 of one embodiment of the present invention. A semiconductor device 900 includes a circuit board 901, a battery 902, and a sensor 903. A label 904 is attached to the battery 902. As illustrated in FIG. 20B, the semiconductor device 900 further includes a terminal 906, a terminal 907, an antenna 908, and an antenna 909.

The circuit board 901 includes terminals 905 and an integrated circuit 910. The terminals 905 are connected to the sensor 903 via wirings 913. Note that the number of the terminals 905 is not limited to two and is determined in accordance with the need.

Furthermore, the circuit board 901 may be provided with a semiconductor element such as a transistor or a diode, a resistor, a wiring, or the like.

The shapes of the antenna 908 and the antenna 909 are not limited to coil shapes, and may be linear shapes or plate shapes, for example.

The integrated circuit 910 includes a circuit formed using a Si transistor or an OS transistor.

The sensor 903 is a circuit having a function of outputting a variety of information such as thermal, mechanical, and electromagnetic information, as analog data.

The semiconductor device 900 includes a layer 912 between the battery 902 and the antenna 908 and the antenna 909. The layer 912 has, for example, a function of blocking an electromagnetic field by the battery 902. As the layer 912, for example, a magnetic body can be used.

Figure 21A:
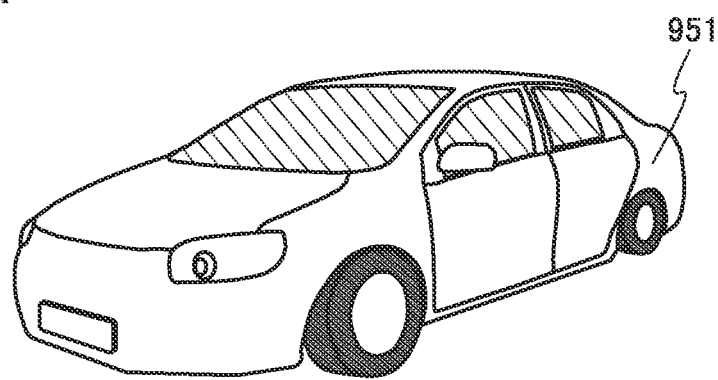
FIG. 21A and FIG. 21B are diagrams illustrating an application example of a semiconductor device.
Figure 21B:
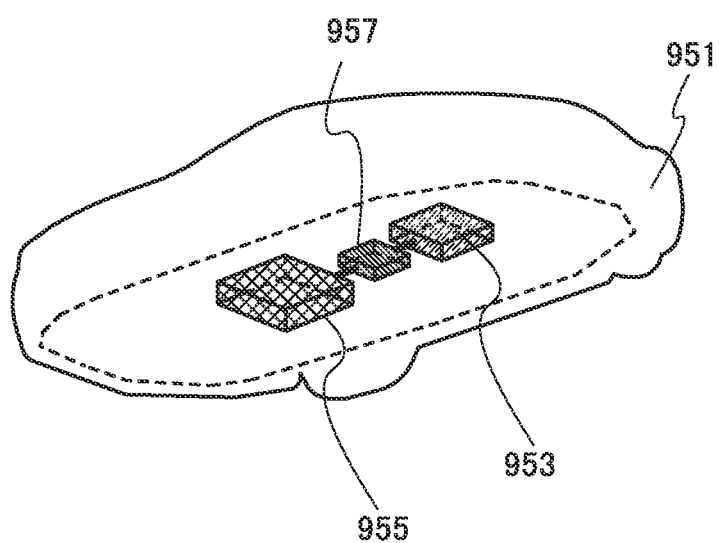

An application example of the semiconductor device 900 to another device can be described with reference to schematic views illustrated in FIG. 21A and FIG. 21B. FIG. 21A is a perspective view of an automobile 951. FIG. 21B is a transparent view of the automobile 951 in FIG. 21A. The automobile 951 is driven when a control signal is supplied to a power unit 953. The automobile 951 includes a battery 955 that supplies power for supplying a control signal to the power unit 953, and a control unit 957.

For example, the semiconductor device 900 is installed in the battery 955 inside the automobile 951. When the user gets in the automobile 951, the control unit 957 is started up, and analog data relating to anomaly detection of the battery 955 is collected in the control unit 957. The semiconductor device 900 can obtain information such as the temperature around the battery 955 without starting of an A/D converter and the like. As described above, the power consumption for driving the A/D converter circuit can be reduced, and thus the consumption of the battery at the time of stopping can be reduced.

Figure 22A:
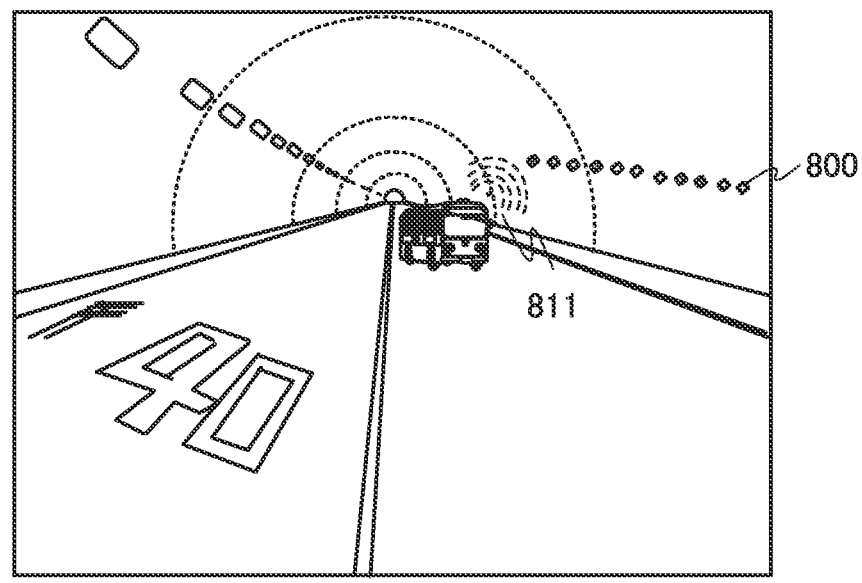
FIG. 22A and FIG. 22B are diagrams illustrating application examples of a semiconductor device.

Another application mode of the semiconductor device can be described with reference to a schematic view in FIG. 22A. For example, the semiconductor device 800 is embedded in a wall surface of a tunnel, and the wireless signal 811 is sent from the outside. The semiconductor device 800, which has received the wireless signal 811, can obtain information of the wall surface of the tunnel by the sensor and send the information. The use of the semiconductor device described in Embodiment 1 as the semiconductor device 800 enables efficient investigation of the disrepair of the wall surface of the tunnel.

Figure 22B:
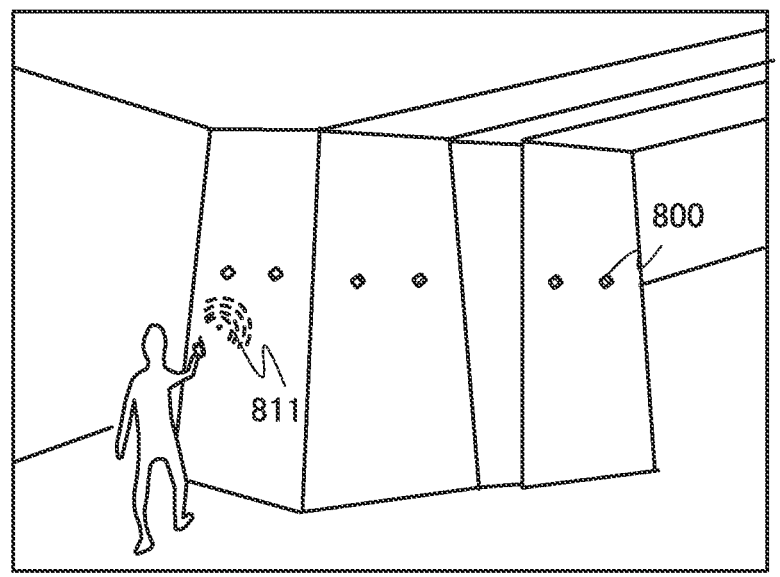

Another application mode of a wireless sensor can be described with reference to a schematic view in FIG. 22B. For example, the semiconductor device 800 is embedded in a wall surface of a pillar of a bridge, and the wireless signal 811 is sent from the outside. The semiconductor device 800, which has received the wireless signal 811, can obtain information of the inside of the pillar of the bridge by the sensor and send the information. The use of the semiconductor device described in Embodiment 1 as the semiconductor device 800 enables efficient investigation of the disrepair in the pillar of the bridge.

Figure 23A:
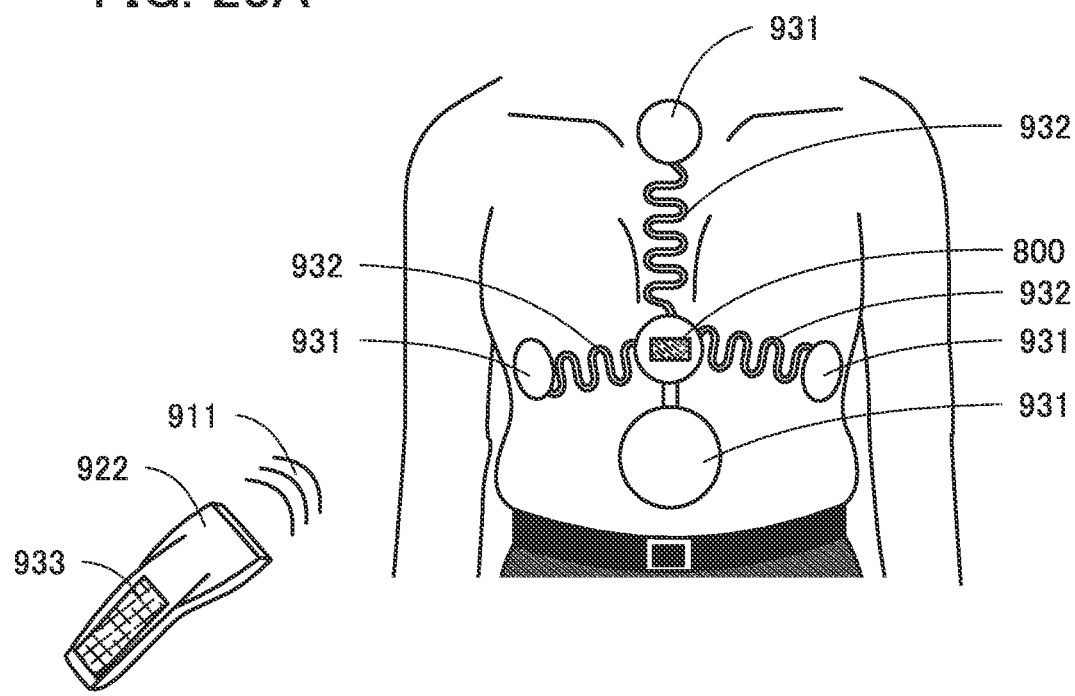
FIG. 23A and FIG. 23B are diagrams illustrating application examples of a semiconductor device.

Another application mode of the wireless sensor can be described with reference to a schematic view in FIG. 23A. For example, the semiconductor device 800 is attached to a human body with the use of a bond pad or the like, and a wireless signal 911 is sent from a reader 922. The semiconductor device 800, which has received the wireless signal 911, can obtain information such as biological information by supplying a signal through a wiring 932 to an electrode 931 or the like attached to the human body, and send the information. The obtained information can be checked on a display unit 933 of the reader 922. The use of the semiconductor device described in Embodiment 1 as the semiconductor device 800 enables efficient acquisition of biological information of a human body.

Figure 23B:
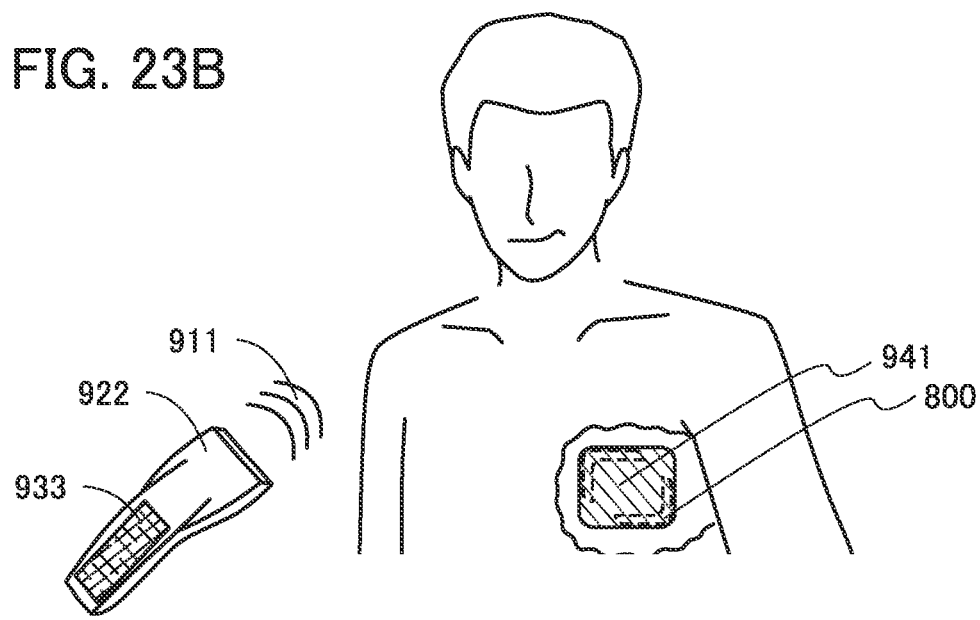

Another application mode of the wireless sensor can be described with reference to a schematic view in FIG. 23B. For example, the semiconductor device 800 which is contained in a housing 941 is implanted in a human body, and the wireless signal 911 is sent from the reader 922 outside the body. The semiconductor device 800, which has received the wireless signal 911, can obtain information such as biological information and send the information. The obtained information can be checked on the display unit 933 of the reader 922. The use of the semiconductor device described in Embodiment 1 as the semiconductor device 800 enables efficient acquisition of biological information of a human body.

Embodiment 5

In this embodiment, a market image where the semiconductor device of one embodiment of the present invention can be used will be described.

\<Market Image\>

Figure 24:
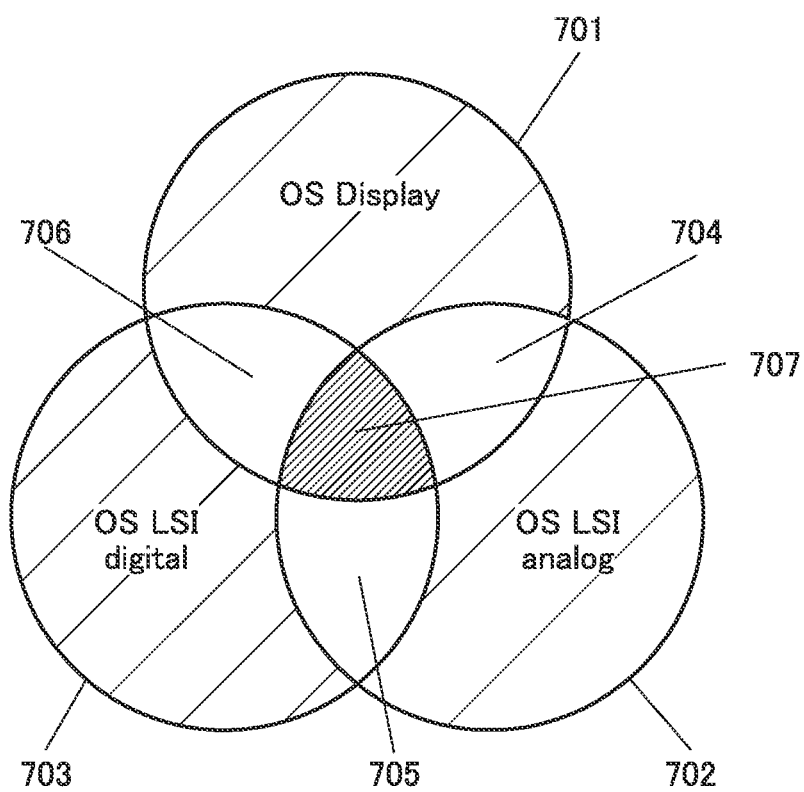
FIG. 24 is a diagram illustrating a market image.

FIG. 24 illustrates a market image where the semiconductor device of one embodiment of the present invention can be used. In FIG. 24, a region 701 represents a product field (OS Display) applicable to a display using a transistor including an oxide semiconductor in a channel formation region; a region 702 represents a product field (OS LSI analog) where an LSI (Large Scale Integration) using a transistor including an oxide semiconductor in a channel formation region can be applied to an analog one; and a region 703 represents a product field (OS LSI digital) where an LSI using a transistor including an oxide semiconductor in a channel formation region can be applied to a digital one. The semiconductor device of one embodiment of the present invention can be favorably used in the three regions: the region 701, the region 702, and the region 703 illustrated in FIG. 24, in other words, three big markets.

In FIG. 24, a region 704 represents a region where the region 701 and the region 702 overlap with each other; a region 705 represents a region where the region 702 and the region 703 overlap with each other; a region 706 represents a region where the region 701 and the region 703 overlap with each other; and a region 707 represents a region where the region 701, the region 702, and the region 703 overlap with one another.

In OS Display, an FET structure such as a bottom-gate OS FET (BG OSFET) or a top-gate OS FET (TG OS FET) can be favorably used. Note that the bottom-gate OS FET includes a channel-etched FET and a channel-protective FET. In addition, the top-gate OS FET includes a TGSA (Top Gate Self-Aligned) FET.

In OS LSI analog and OS LSI digital, a gate-last OS FET (GL OS FET) can be favorably used, for example.

Note that the above-described transistors each include a single-gate transistor with one gate electrode, a dual-gate transistor with two gate electrodes, or a transistor with three or more gate electrodes. Among dual-gate transistors, it is particularly preferable to use an S-channel (surrounded channel) transistor.

Note that in this specification and the like, an S-channel transistor refers to a transistor with a structure in which a channel formation region is electrically surrounded by the electric fields of one of a pair of gate electrodes and the other thereof.

As products included in OS display (the region 701), products in which an LCD (liquid crystal display), EL (Electro Luminescence), and an LED (Light Emitting Diode) are included as display devices can be given. Any of the above display devices is favorably combined with Q-Dot (Quantum Dot).

Note that in this embodiment, EL includes organic EL and inorganic EL. In addition, in this embodiment, LED includes a micro LED, a mini LED, and a macro LED. that in this specification and the like, a light-emitting diode with a chip size less than or equal to 10000 $\mu m^2$ is referred to as a micro LED, a light-emitting diode with a chip size greater than 10000 $\mu m^2$ and less than or equal to 1 $mm^2$ is referred to as a mini LED, and a light-emitting diode with a chip size greater than 1 $mm^2$ is referred to as a macro LED, in some cases.

As products included in OS LSI analog (the region 702), a sound-source identification device that covers a wide frequency range (e.g., an audible sound with a frequency of 20 Hz to 20 kHz or ultrasonic wave of 20 kHz or greater), a battery control device (a battery control IC, a battery protection IC, or a battery management system), and the like can be given.

As products included in OS LSI digital (the region 703), a memory device, a CPU (Central Processing Unit) device, a GPU (Graphics Processing Unit) device, an FPGA (field-programmable gate array) device, a power device, a hybrid device in which an OS LSI and an Si LSI are stacked or mixed, a light-emitting device, and the like can be given.

As products included in the region 704, a display device including an infrared ray sensor or a near-infrared ray sensor in a display region, a sensor-equipped signal processing device including an OS FET, an implantable biosensor device, and the like can be given. As products included in the region 705, a processing circuit including an A/D (Analog to Digital) conversion circuit or the like, an AI (Artificial Intelligence) device including the processing circuit, and the like can be given. As products included in the region 706, a display device using a Pixel AI technology can be given, for example. Note that in this specification and the like, the Pixel AI technology refers to a technology utilizing a memory composed of an OS FET or the like included in a pixel circuit of a display.

As a product included in the region 707, a composite product that combines a variety of products included in the region 701 to the region 706 can be given.

As described above, the semiconductor device of one embodiment of the present invention can be applied to a variety of product fields, as illustrated in FIG. 24. That is, the semiconductor device of one embodiment of the present invention can be applied to a lot of markets.

(Supplementary Notes on the Description in this Specification and the Like)

The description of the above embodiments and each structure in the embodiments are noted below.

One embodiment of the present invention can be constituted by combining, as appropriate, the structure described in each embodiment with the structures described in the other embodiments. In addition, in the case where a plurality of structure examples are described in one embodiment, the structure examples can be combined as appropriate.

Note that content (or may be part of the content) described in one embodiment can be applied to, combined with, or replaced with another content (or may be part of the content) described in the embodiment and/or content (or may be part of the content) described in another embodiment or other embodiments.

Note that in each embodiment, content described in the embodiment is content described using a variety of diagrams or content described with text disclosed in the specification.

Note that by combining a diagram (or may be part thereof) described in one embodiment with another part of the diagram, a different diagram (or may be part thereof) described in the embodiment, and/or a diagram (or may be part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in this specification, and the description can be changed appropriately depending on the situation.

Furthermore, in the drawings, the size, the layer thickness, or the region is shown with given magnitude for description convenience. Therefore, the size, the layer thickness, or the region is not limited to the illustrated scale. Note that the drawings are schematically shown for clarity, and embodiments of the present invention are not limited to shapes, values or the like shown in the drawings. For example, variation in signal, voltage, or current due to noise, variation in signal, voltage, or current due to difference in timing, or the like can be included.

In this specification and the like, the expressions "one of a source and a drain" (or a first electrode or a first terminal) and "the other of the source and the drain" (or a second electrode or a second terminal) are used to describe the connection relation to a source and a drain of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential applied to a wiring or the like is sometimes changed depending on the reference potential.

Note that in this specification and the like, the terms such as "film" and "layer" can be interchanged with each other depending on the case or according to circumstances. For example, the term "conductive layer" can be changed into the term "conductive film" in some cases. For another example, the term "insulating film" can be changed into the term "insulating layer" in some cases.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate electrode overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

In this specification and the like, the expression "A and B are connected" includes the case where A and B are electrically connected as well as the case where A and B are directly connected. Here, the expression "A and B are electrically connected" includes the case where electric signals can be transmitted and received between A and B when an object having any electric action exists between A and B.

REFERENCE NUMERALS

F_N: node, F_1: node, F_2: node, F_3: node, $S_{R\_}1$: signal, $S_{R\_}2$: signal, $S_{R\_}3$: signal, ST72: dicing step, $S_{W\_}1$: signal, $S_{W\_}2$: signal, $S_{W\_}3$: signal, t1: time, t2: time, t3: time, T1: time, T2: time, T3: time, tN: time, $T_N$: time, 20: power supply device, 100A: semiconductor device, 100B: semiconductor device, 101: antenna, 102: transmitting/receiving circuit, 103: control circuit, 104: battery, 105: timer circuit, 106: memory circuit, 107: A/D converter circuit, 108: sample-and-hold circuit, 108A: sample-and-hold circuit, 108B: sample-and-hold circuit, 108C: sample-and-hold circuit, 109: sensor, 111: selection circuit, 112: signal retention circuit, 112_N: signal retention circuit, 112_1: signal retention circuit, 112_2: signal retention circuit, 112A: signal retention circuit, 113: selection circuit, 121: transistor, 121A: transistor, 121B: transistor, 122: transistor, 123: transistor, 124: transistor, 124A: transistor, 124B: transistor, 131: solar cell, 132: photodetector circuit, 141: constant voltage circuit, 142: power supply control circuit, 143: switch, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 503: conductor, 503a: conductor, 503b: conductor, 510: insulator, 512: insulator, 514: insulator, 516: insulator, 518: conductor, 520: insulator, 522: insulator, 524: insulator, 530: oxide, 530a: oxide, 530b: oxide, 530c: oxide, 540a: conductor, 540b: conductor, 542: conductor, 542a: conductor, 542b: conductor, 543a: region, 543b: region, 544: insulator, 546: conductor, 548: conductor, 550: insulator, 560: conductor, 560a: conductor, 560b: conductor, 574: insulator, 580: insulator, 581: insulator, 582: insulator, 586: insulator, 600: capacitor, 610: conductor, 612: conductor, 620: conductor, 630: insulator, 640: insulator, 701: region, 702: region, 703: region, 704: region, 705: region, 706: region, 707: region, 800: semiconductor device, 801: antenna, 802: integrated circuit portion, 803: circuit, 804: terminal portion, 805: sensor, 806: battery, 811: wireless signal, 821: article, 822: interrogator, 900: semiconductor device, 901: circuit board, 902: battery, 903: sensor, 904: label, 905: terminal, 906: terminal, 907: terminal, 908: antenna, 909: antenna, 910: integrated circuit, 911: wireless signal, 912: layer, 913: wiring, 922: reader, 931: electrode, 932: wiring, 933: display unit, 941: housing, 951: automobile, 953: power unit, 955: battery, 957: control unit, 7000: electronic component, 7001: lead, 7002: printed circuit board, 7004: circuit board, 7100: semiconductor wafer, 7102: circuit region, 7104: separation region, 7106: separation line, 7110: chip

The invention claimed is:

1. A semiconductor device comprising:
a sensor;
a sample-and-hold circuit to which a sensor signal of the sensor is input;
an analog-digital converter circuit to which an output signal of the sample-and-hold circuit is input;
a control circuit;
a battery; and
an antenna,
wherein the sample-and-hold circuit comprises a first selection circuit, a plurality of signal retention circuits, and a second selection circuit, and wherein the control circuit is configured to control so that a potential corresponding to the sensor signal is retained in the plurality of signal retention circuits successively by the first selection circuit in a first period during which power is supplied from the battery, and to control so that the output signal based on the potential retained in the plurality of signal retention circuits is output by the second selection circuit in a second period during which power is supplied from outside through the antenna.

2. The semiconductor device according to claim 1, wherein the sample-and-hold circuit comprises first to fourth transistors, and
wherein the first to fourth transistors each comprise a semiconductor layer comprising an oxide semiconductor in a channel formation region.

3. The semiconductor device according to claim 2, wherein the first transistor functions as a selection switch in the first selection circuit.

4. The semiconductor device according to claim 2, wherein the signal retention circuit comprises the first and second transistors,
wherein a gate of the second transistor is electrically connected to one of a source and a drain of the first transistor, and
wherein the semiconductor device is configured to retain a potential corresponding to the sensor signal when the first transistor is turned off.

5. The semiconductor device according to claim 2, wherein the second and third transistors are configured to be a source follower circuit.

6. The semiconductor device according to claim 2, wherein the fourth transistor is configured to be a selection switch in the second selection circuit.

7. The semiconductor device according to claim 1, further comprising:
a timer circuit and a power supply control circuit,
wherein the power supply control circuit is configured to be control so that the sensor and the first selection circuit are operated intermittently, in accordance with an output signal of the timer circuit.

8. A semiconductor device comprising:
a sensor;
a sample-and-hold circuit to which a sensor signal of the sensor is input;
an analog-digital converter circuit to which an output signal of the sample-and-hold circuit is input;
a control circuit;
a battery; and
a photoelectric conversion device,
wherein the sample-and-hold circuit comprises a first selection circuit, a plurality of signal retention circuits, and a second selection circuit, and
wherein the control circuit is configured to control so that a potential corresponding to the sensor signal is retained in the plurality of signal retention circuits successively by the first selection circuit in a first period during which power is supplied from the battery, and to control so that the output signal based on the potential retained in the plurality of signal retention circuits is output by the second selection circuit in a second period during which power is supplied from the photoelectric conversion device.

9. The semiconductor device according to claim 8, wherein the sample-and-hold circuit comprises first to fourth transistors, and
wherein the first to fourth transistors each comprise a semiconductor layer comprising an oxide semiconductor in a channel formation region.

10. The semiconductor device according to claim 9, wherein the first transistor is configured to be a selection switch in the first selection circuit.

11. The semiconductor device according to claim 9, wherein the signal retention circuit comprises the first and second transistors,
wherein a gate of the second transistor is electrically connected to one of a source and a drain of the first transistor, and
wherein the semiconductor device is configured to retain a potential corresponding to the sensor signal when the first transistor is turned off.

12. The semiconductor device according to claim 9, wherein the second and third transistors are configured to be a source follower circuit.

13. The semiconductor device according to claim 9, wherein the fourth transistor is configured to be a selection switch in the second selection circuit.

14. The semiconductor device according to claim 8, further comprising:
a photodetector circuit and a power supply control circuit,
wherein the power supply control circuit is configured to control so that the sensor and the first selection circuit are operated intermittently, in accordance with an output signal of the photodetector circuit.

* * * * *